(12) United States Patent
Osada et al.

(10) Patent No.: US 7,907,435 B2
(45) Date of Patent: Mar. 15, 2011

(54) SEMICONDUCTOR DEVICE

(75) Inventors: Kenichi Osada, Tokyo (JP); Naoki Kitai, Tachikawa (JP); Takayuki Kawahara, Higashiyamato (JP); Kazumasa Yanagisawa, Machida (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 132 days.

(21) Appl. No.: 11/915,126

(22) PCT Filed: Sep. 21, 2005

(86) PCT No.: PCT/JP2005/017352
§ 371 (c)(1),
(2), (4) Date: Nov. 20, 2007

(87) PCT Pub. No.: WO2007/034542
PCT Pub. Date: Mar. 29, 2007

(65) Prior Publication Data
US 2009/0073753 A1 Mar. 19, 2009

(51) Int. Cl.
*G11C 11/00* (2006.01)
(52) U.S. Cl. .................. 365/148; 365/163
(58) Field of Classification Search .......... 365/148, 365/163
See application file for complete search history.

(56) References Cited

U.S. PATENT DOCUMENTS

| | | | |
|---|---|---|---|
| 4,228,524 A * | 10/1980 | Neale et al. ............... | 365/163 |
| 6,487,113 B1 | 11/2002 | Park et al. | |
| 6,570,784 B2 * | 5/2003 | Lowrey ..................... | 365/163 |
| 6,707,712 B2 * | 3/2004 | Lowery ..................... | 365/163 |
| 6,885,602 B2 | 4/2005 | Cho et al. | |
| 7,012,834 B2 * | 3/2006 | Cho et al. ................. | 365/163 |
| 7,020,014 B2 * | 3/2006 | Khouri et al. ............ | 365/163 |
| 7,082,051 B2 * | 7/2006 | Ha et al. .................. | 365/163 |
| 7,110,286 B2 * | 9/2006 | Choi et al. ............... | 365/163 |
| 7,126,847 B2 * | 10/2006 | Ha et al. .................. | 365/163 |
| 7,149,103 B2 * | 12/2006 | Ahn ......................... | 365/163 |
| 7,180,771 B2 * | 2/2007 | Cho et al. ................. | 365/163 |

(Continued)

FOREIGN PATENT DOCUMENTS

EP 1 420 412 A1 5/2004

(Continued)

OTHER PUBLICATIONS

M. Gill, "Ovonic Unified Memory—A High-Performance Nonvolatile Memory Technology for Stand-Alone Memory and Embedded Applications," 2002 IEEE International Solid-State Circuits Conference, 2002, pp. 202-203.

*Primary Examiner* — Trong Phan
(74) *Attorney, Agent, or Firm* — Miles & Stockbridge P.C.

(57) ABSTRACT

At the time of, for example, a set operation (SET) for making a phase-change element in a crystalline state, a pulse of a voltage Vreset required for melting the element is applied to the phase-change element, and subsequently a pulse of a voltage Vset that is lower than Vreset and is required for crystallizing the element is applied thereto. And, the magnitude of this voltage Vset is then changed depending on the ambient temperature so that the magnitude of the voltage Vset is small as the temperature becomes high (TH). In this manner, a margin of a write operation between the set operation and a reset operation (RESET) for making the element to be in amorphous state is improved.

8 Claims, 18 Drawing Sheets

U.S. PATENT DOCUMENTS

| | | | |
|---|---|---|---|
| 7,327,602 B2 * | 2/2008 | Kostylev et al. | 365/163 |
| 7,436,711 B2 * | 10/2008 | Cho et al. | 365/163 |
| 7,443,721 B2 * | 10/2008 | Kurotsuchi et al. | 365/163 |
| 7,460,389 B2 * | 12/2008 | Hsu et al. | 365/163 |
| 7,502,251 B2 * | 3/2009 | Choi et al. | 365/163 |
| 7,511,993 B2 * | 3/2009 | Choi et al. | 365/163 |
| 7,515,459 B2 * | 4/2009 | Kang et al. | 365/163 |
| 7,564,710 B2 * | 7/2009 | Happ et al. | 365/163 |
| 7,571,901 B2 * | 8/2009 | Philipp | 365/163 |
| 7,773,409 B2 * | 8/2010 | Chen et al. | 365/163 |
| 7,773,410 B2 * | 8/2010 | Sheu et al. | 365/163 |
| 7,787,281 B2 * | 8/2010 | Sheu et al. | 365/163 |
| 7,796,426 B2 * | 9/2010 | Tonomura et al. | 365/163 |
| 2003/0123277 A1 | 7/2003 | Lowrey et al. | |
| 2004/0151023 A1 | 8/2004 | Khouri et al. | |

FOREIGN PATENT DOCUMENTS

| | | |
|---|---|---|
| JP | 2005-108395 A | 9/1987 |
| JP | 2003-298013 A | 10/2003 |
| JP | 09-23-2004 A1 | 4/2005 |
| JP | 2005-122875 A | 5/2005 |
| WO | WO 2004/081944 A1 | 9/2004 |

* cited by examiner

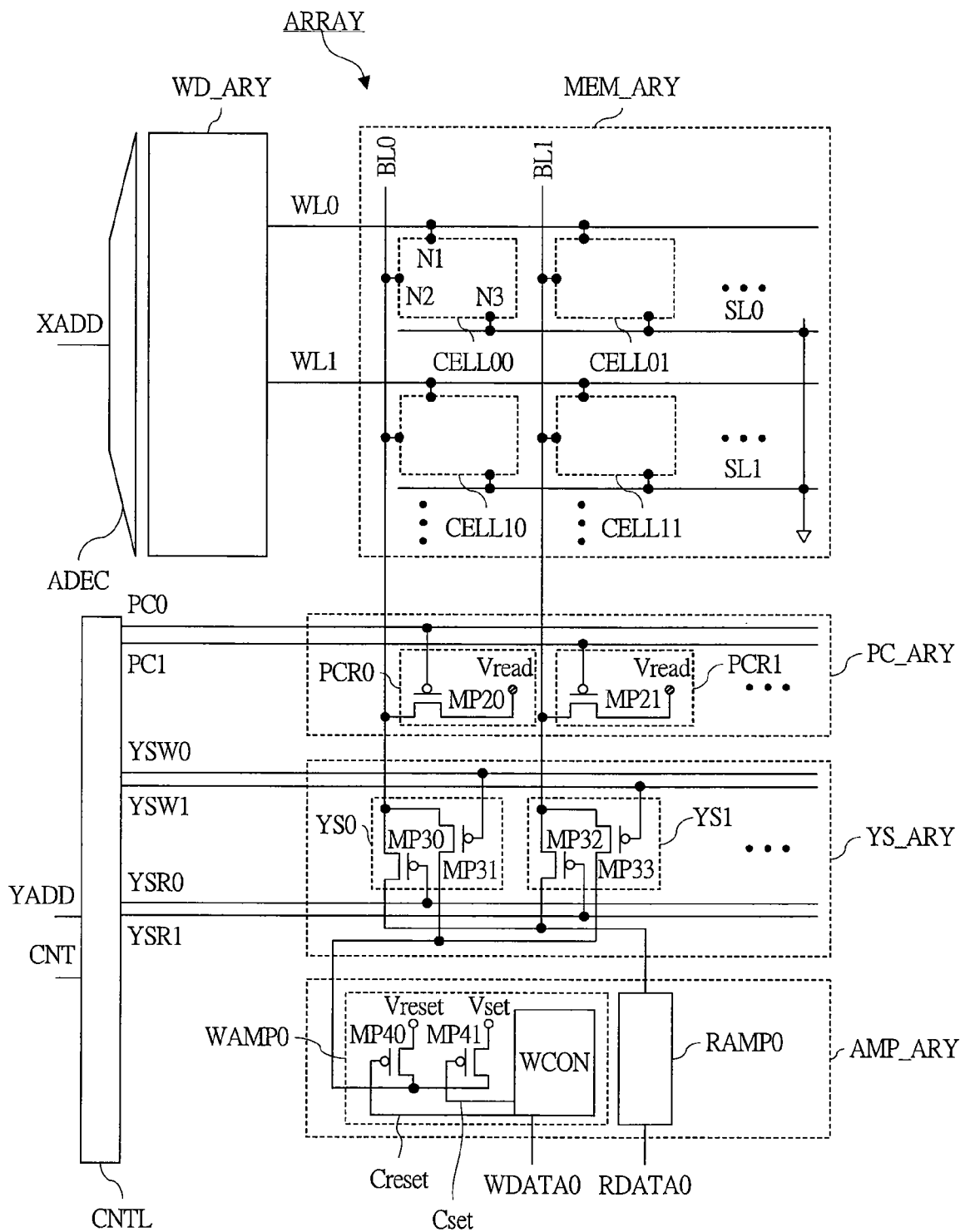

SEMICONDUCTOR DEVICE

TECHNICAL FIELD

The present invention relates to a semiconductor device, more particularly, it relates to a semiconductor device such as a system LSI (microcomputer and the like) having an on-chip memory and a single non-volatile memory.

BACKGROUND ART

In order to achieve a high-speed and highly-integrated non-volatile memory, a phase-change memory has been developed. The phase-change memory is disclosed in Non-Patent Document 1 ("2002 IEEE International Solid-State Circuits Conference, Digest of Technical Papers", pp. 202 to 203), Patent Document 1 (U.S. Pat. No. 6,487,113), and Patent Document 2 (U.S. Patent Application Publication No. 2004/0151023).

For example, as disclosed in the Non-Patent Document 1, the phase-change memory stores information by using the fact that a phase-change element called a chalcogenide material has a resistance that differs according to its state. Rewriting of the phase-change element is performed by feeding current through the phase-change element for heating. Such a rewrite operation includes those called a reset (RESET) operation and a set (SET) operation. The reset operation is an operation of keeping the phase-change element at a relatively high temperature so that the element is in a high-resistance state (amorphous state). The set operation is an operation of keeping the phase-change element at a relatively low temperature for a sufficient period so that the element is in a low-resistance state (crystalline state). Herein, reading of the phase-change element is performed by feeding current within a range not to change the state of the phase-change element and identifying its high/low resistance.

Also, the Patent Document 1 discloses a method of performing a set operation by first keeping the phase-change element at a relatively high temperature and then subsequently decreasing the temperature in a stepwise manner to a relatively low temperature. Furthermore, the Patent Document 2 describes a system of changing a write condition and a read condition according to an ambient temperature. This Patent Document 2 points out that, because the required set current and reset current are changed according to the ambient temperature, if the set current is fixed at a maximum value, the set current may cause an erroneous reset at some ambient temperature and therefore an operation margin is lost. Moreover, if the reset current is fixed at the maximum value, it is pointed out that an over-reset may occur at some ambient temperature. Still further, it is pointed out that the resistance value in a reset state is changed according to the ambient temperature and thus operation margin at the time of a read determination is lost.

To solve these problems, there is disclosed means in which a chalcogenic resistor same as memory cell materials is used to configure a temperature sensor so that temperature is corrected. That is, this means detects temperature change of a memory cell by a temperature sensor arranged near a memory array and generates a reference voltage reflecting the change, and then this reference voltage is used to generate a set current, a reset current, and a read determination current depending on (inversely proportional to) temperature.

Non-Patent Document 1: "2002 IEEE International Solid-State Circuits Conference, Digest of Technical Papers", pp. 202 to 203

Patent Document 1: U.S. Pat. No. 6,487,113

Patent Document 2: U.S. Patent Application Publication No. 2004/0151023

DISCLOSURE OF THE INVENTION

Meanwhile, as a result of study by the inventors of the present invention about the technique of writing of the phase-change memory as described above, the following has been revealed.

Firstly, prior to the present application, the inventors of the present invention evaluated characteristics of a phase-change element. As a result of the evaluation, it was found that, in consideration of element variations, operation margin cannot be ensured only by temperature correction. For this reason, a method was studied for performing a set operation by keeping the phase-change element at a relatively high temperature and then keeping at a relatively low temperature to evaluate the characteristics of the phase-change element with changing the ambient temperature.

As a result, it was found that a condition for keeping the phase-change element at a relatively high temperature can be same as that of a writing condition at the time of reset and current to be applied is affected little from the ambient air, thereby widening the operation margin. However, it was found that optimal voltage/current conditions are changed according to the ambient air temperature when the temperature is kept at a relatively low. Thus, if a temperature correction is performed at this moment, the operation margin can be widened.

Meanwhile, a system example of temperature correction is a system of using a phase-change element as a temperature sensor, as disclosed in the Patent Document 2. In this case, the phase-change element is desired to be in an amorphous state because the element is required to have a resistance value that is changed depending on temperature. However, since this state is unstable, the characteristics of the temperature sensor themselves are changed with time, thereby causing a concern that this error may decrease the operation margin.

The present invention has been made in view of these problems. The above and other objects and novel characteristics of the present invention will be apparent from the description of this specification and the accompanying drawings.

The typical ones of the inventions disclosed in this application will be briefly described as follows.

A semiconductor device according to the present invention has: a memory element that is in a crystalline state according to a set operation and in an amorphous state according to a reset operation; and various input/output circuits for performing a set operation, a reset operation, and a read operation on the memory element. And, in the set operation, after a first pulse is applied to the memory element, a second pulse is subsequently applied, and this second pulse is changed depending on an ambient temperature. By using the two-stage pulse, it is possible to improve an operation margin, which becomes a difference between a write current value (voltage value) associated with the set operation and a write current value (voltage value) associated with the reset operation, and furthermore, a decrease of this operation margin according to its temperature dependency can be suppressed by applying a temperature correction on the second pulse.

Here, as for the reset operation, an influence of temperature dependency onto the operation margin is small, and so such temperature correction is preferably not performed. This results in some advantages, such that ensuring a withstand voltage of an MOS transistor and reducing a circuit area.

Further, more specifically, in the configuration described above, when the first and second pulses are voltage pulses, the voltage value of the second pulse has a negative temperature characteristic with respect to temperature. The same goes to the case where current pulses are used in place of voltage pulses. Furthermore, in place of changing the voltage value of the second pulse, the pulse width or the falling speed (gradient) of the first pulse can be changed.

Herein, for example, when it is a system of changing a voltage value of voltage pulse, a circuit of generating this voltage value is preferably not of a system of using a resistance element or the like having temperature dependency but of a system of using temperature characteristics of a MOS transistor. In this manner, a temperature-dependent voltage value can be supplied with high accuracy and stability with time.

Still further, the semiconductor device according to the present invention has a configuration in which, in addition to the set operation, the reset operation and the read operation, a verify operation is further provided. This verify operation is performed after the reset operation to determine a resistance value of the memory element according to the reset operation. This verify operation is performed by, for example, obtaining a voltage level or a current level corresponding to the resistance value of the memory element through application of a voltage or current to the memory element and comparing this level with a determination reference level. Herein, the temperature correction as described above is performed on this determination reference level in the present invention.

More specifically, since the resistance value of the memory element associated with the reset operation has temperature dependency, the verify operation having the temperature correction as described above is performed, thereby making it possible to use different resistance values for respective temperatures as a determination reference. In this manner, the resistance value of the memory element at the time of reset can be controlled so as not to be below a resistance value defined as reset, thereby improving the operation margin associated with the reset operation.

On the other hand, the read operation is performed in a manner similar to this verify operation, but the determination reference level in this read operation is preferably not subjected to a temperature correction. That is, since the resistance value of the memory element at the time of reset may possibly be changed (decreased) with time, a large determination operation margin at the time of determining a resetting side is preferably ensured. If the determination reference level in the read operation is constant independently of temperature, it is possible to achieve such securement of determination operation margin.

The effects obtained by typical aspects of the present invention is an improvement of operation margin for a phase-change memory.

BRIEF DESCRIPTIONS OF THE DRAWINGS

FIG. 1 is a schematic view of one example of configuration of a memory array in a semiconductor device according to an embodiment of the present invention;

BEST MODE FOR CARRYING OUT THE INVENTION

Figure 2A:
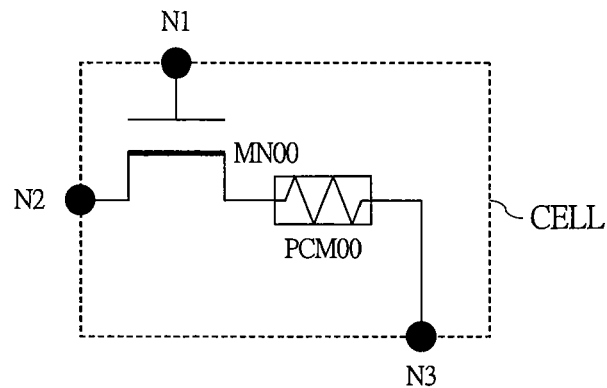
FIG. 2 shows circuit diagrams showing an example of configuration of a memory cell in the semiconductor device of FIG. 1, in which FIG. 2A and FIG. 2B each shows different configuration example.

Hereinafter, several suitable cases of semiconductor device according to the present invention are described with reference to the drawings. Circuit elements forming each functional block of the embodiments are not particularly limited, and formed on a single semiconductor substrate such as that of single-crystal silicon through an integrated circuit technology for the known CMOS (complementary MOS transistor) and the like. Also, in the drawings, the gate of a PMOS transistor is provided with a circle sign, thereby distinguishing the PMOS transistor from an NMOS transistor. Herein, in the drawings, although connection of a substrate potential of a MOS transistor is not particularly depicted, a method of connection thereof is not particularly limited as long as the MOS transistor can normally operate. Furthermore, unless otherwise noted, low level of a signal is represented as "L" or "0" and high level thereof is represented as "H" or "1".

<Memory Array Configuration>

Figure 2B:
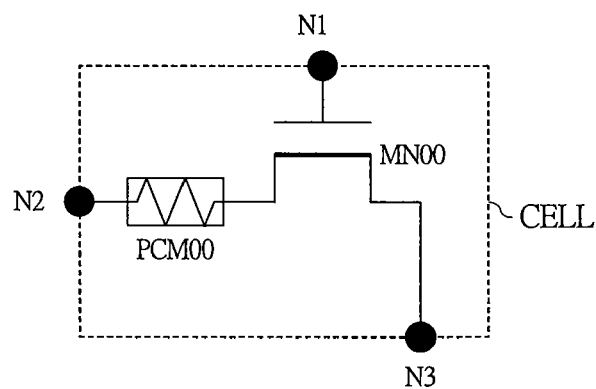
Figure 3:
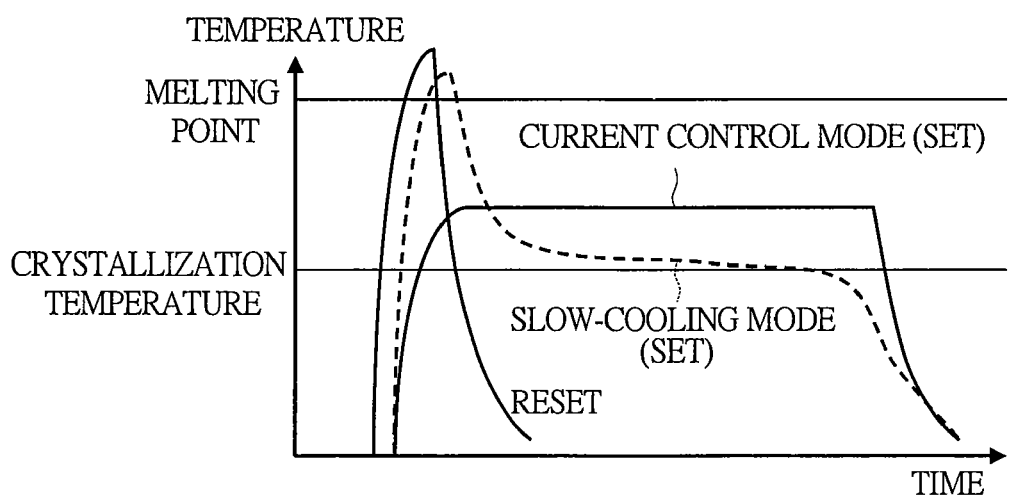
FIG. 3 is a waveform diagram for describing one example of write operation system with respect to a memory element of FIG. 2.

FIG. 1 is a schematic view of one example of configuration of a memory array in a semiconductor device according to an embodiment of the present invention. FIG. 2 shows circuit diagrams each depicting one example of configuration of a memory cell in the semiconductor device of FIG. 1, respectively showing different configuration examples. FIG. 3 is a waveform diagram for describing one example of write operation system with respect to a memory element of FIG. 2A and FIG. 2B.

A memory array ARRAY of FIG. 1 is mounted as an on-chip memory in a microcomputer and the like or is mounted in a single non-volatile memory. A memory-cell array MEM_ARY is formed of a plurality of word lines WL and a plurality of bit lines BL (BL0 and BL1), and a memory cell CELL is connected at an intersection point of the word line WL and the bit line BL. Each memory cell CELL (CELL00, CELL01, CELL10, CELL11) is connected to, as exemplified by a memory cell CELL00, the word line WL at a node N1, the bit line BL at a node N2, and a source line SL (herein, ground voltage) at a node N3.

Each memory cell CELL is formed of, as shown in FIG. 2A and FIG. 2B, an N-channel MOS transistor MN00 and a memory element PCM00. FIG. 2A shows a configuration in which the memory element PCM00 has one end connected to the node N3 (ground voltage), whilst FIG. 2B shows a configuration in which the memory element PCM00 has one end connected to the node N2 (bit line).

The memory element PCM00 is, for example, an element called phase-change element, which has features of having low resistance on the order of 10 kΩ in a crystalline state and having high resistance equal to or larger than 100 kΩ in an amorphous state by way of example. The state of the memory element PCM00 can be changed by temperature applied thereto. Specifically, as shown in FIG. 3, a reset operation (RESET) obtains an amorphous state by applying a high temperature to the memory element for melting (MELTING POINT) and then rapidly cooling, and a set operation (SET) obtains a crystalline state by applying a low temperature (CRYSTALLIZATION TEMPERATURE) to the memory element for a relatively long time (this is referred to as a current control mode). On the other hand, another possibility is a set operation of first applying a high temperature to the memory element for melting and then slowly cooling, thereby forming a crystalline state (this is referred to as a slow-cooling mode).

In the current control mode, if a current is fed too much at the time of the set operation, an erroneous reset occurs. In the slow-cooling mode, since the memory element is once melted in both of the set operation and the reset operation, a maximum current amount is not required to be changed between the set operation and the reset operation. Therefore, it is a feature that the operation margin is increased. Herein, the temperature to be applied to the element can be changed by changing a current value to be fed through the memory element PCM00 and a current-feeding time.

A gate electrode of the N-channel MOS transistor MN00 has connected thereto the word line WL via the node N1 to be controlled so as to be in an ON state with a WL-selected state and in an OFF state with a WL-unselected state. Further, the memory cell according to the present embodiment reads information from a resistance value of the memory element PCM00, in other words, the magnitude of the current value flowing from the bit line BL to the source line SL (SL0 or SL1). Therefore, one terminal of the phase-change element PCM00 may be connected to the ground voltage via the node N3 as shown in FIG. 2A or one terminal of PCM00 may be connected to the bit line via the node N2 as shown in FIG. 2B. In the present specification, unless otherwise stated, the memory cell shown in FIG. 2B is used.

To the word lines WL, as shown in FIG. 1, word driver circuits are connected. The word driver circuits are arranged forming a column to form a word driver array WD_ARY. To a decoder circuit ADEC, an X-system address XADD is inputted. The word driver circuits select one word line WL according to an output of the decoder circuit ADEC.

To the bit lines BL, read pre-charge circuits PCR are connected. The read pre-charge circuits PCR are arranged forming a row to form a pre-charge circuits array PC_ARY. Specifically, for example, a pre-charge circuit PCR0 is formed of a P-channel MOS transistor MP20 having a drain electrode connected to a bit line BL0, a gate electrode connected to a pre-charge signal PC0, and a source electrode connected to a read power-supply potential line Vread, respectively. And, the read pre-charge circuits PCR are alternately connected to pre-charge signals (PC0, PC1).

To the bit lines BL, column selection circuits YS are further connected. The column selection circuits YS (YS0, YS1) are arranged forming a column to form a column selection circuit array YS_ARY. Specifically, for example, a column selection circuit YS0 is formed of P-channel MOS transistors (MP30, MP31), having a drain electrode of the P-channel MOS transistor MP30 connected to the bit line BL0, a gate electrode connected to a control signal YSR0, and a source electrode connected to a read amplifier circuit RAMP0, respectively. And, a drain electrode of the P-channel MOS transistor MP31 is connected to the bit line BL0, a gate electrode thereof is connected to a control signal YSW0, and a source electrode thereof is connected to a write amplifier circuit WAMP0, respectively.

The column selection circuits YS are alternately connected to control signal lines (YSR0 or YSR1 and YSW0 or YSW1). Therefore, the bit lines BL to be read or written in parallel are alternately controlled. That is, a memory cell adjacent to a memory cell that is performing a read operation or write operation is always in an unselected state. In this manner, memory cells alternately generate heat, thereby preventing locally occurring heat and improving a stable operation of the semiconductor device. Note that, the pre-charge signal PC and the control signals YSR and YSW are generated via a control circuit CNTL based on a Y-system address YADD.

The read amplifier circuit RAMP amplifies data on the bit line BL and outputs the amplified data to a data bus RDATA. Upon receiving a data bus WDATA, the write amplifier circuit WAMP supplies an appropriate write voltage to the bit line BL.

The read amplifier circuit RAMP and the write amplifier circuit WAMP are aligned forming a row to form an amplifier array AMP_ARY. The write amplifier circuit WAMP0 includes a P-channel MOS transistor MP40 that supplies a reset voltage Vreset to the bit line BL, a P-channel MOS transistor MP41 that supplies a set voltage Vset to the bit line BL, and a control circuit WCON that controls gate electrodes (Creset, Cset) of the P-channel MOS transistors (MP40, MP41) based on the value of a data bus WDATA0.

<Operation System>

Figure 4:
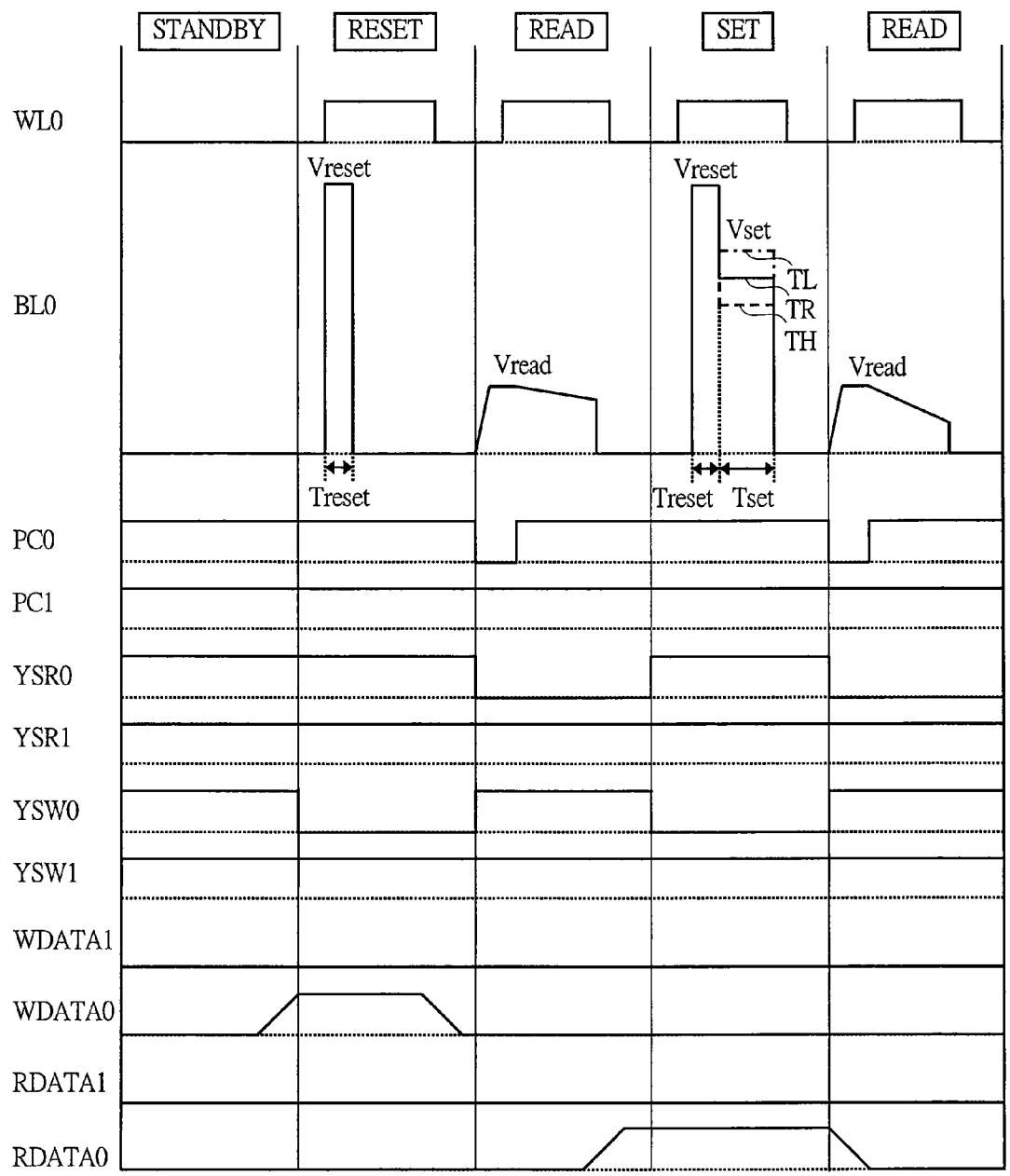
FIG. 4 is a waveform diagram of one example of an operation in the semiconductor device of FIG. 1.

FIG. 4 is a waveform diagram of one example of operation of the semiconductor device of FIG. 1. In FIG. 4, voltage of the bit line BL0 is shown in an enlarged manner for easy viewing. Herein, a case by way of example is described in which data "1" is written in a memory cell CELL00 and is then read, and further data "0" is written and then read. The data "1" means resetting the phase-change element and making the resistance value at 100 kΩ to 1 MΩ. The data "0" means setting the phase-change element and making the resistance value at 1 kΩ to 10 kΩ.

First, from STANDBY operation, the reset operation RESET associated with writing of the data "1" inputs an address ADD and write data WDATA0. The address ADD is divided into the X-system address XADD to be inputted to the decoder circuit ADEC and the Y-system address YADD to be inputted to the control circuit CNTL. The X-system address is decoded in the decoder circuit ADEC, and one selected word line WL makes a transition from "L" to "H". It is assumed herein that a word line WL0 is selected. The Y-system address YADD is decoded in the control circuit CNTL to become a signal (YSW, YSR) for selecting a column. It is assumed herein that a write control signal YSW0 is selected, and therefore YSW0 makes a transition from "H" to "L".

The write data WDATA0 is inputted to the write amplifier circuit WAMP0, and WAMP0 supplies a corresponding voltage to the bit line BL0 depending on whether WDATA0 indicates "0" or "1". When the data "1" is written, the MP40 becomes ON, thereby supplying the voltage Vreset to the bit line BL0. After the voltage Vreset is applied for a period (Treset) sufficient to reset the memory element PCM, the word line WL0 is turned OFF, thereby ending the write operation. Through the above-described operation, the element is melted and then rapidly cooled to be amorphous.

Subsequently, the read operation READ from the memory cell CELL00 selects the word line WL0 and the control signal YSR0 according to the address ADD. Note that, before the word line WL0 is selected, a pre-charge control signal PC0 is changed from "H" to "L", and the bit line BL0 is pre-charged at a read voltage Vread in advance. Since the Vread is a voltage that allows reading without destroying the memory element, the Vread normally has a value smaller than the Vset.

Then, the control signal PC0 is changed from "L" to "H", thereby discharging the charge of the bit line BL0 to the source line (here, ground voltage) via the memory cell CELL00. Herein, since the memory element PCM of the memory cell CELL00 is in a reset state and its resistance is high as, for example, 100 kΩ to 1 MΩ, the voltage of the bit line BL0 is changed little. The read amplifier circuit RAMP amplifies this voltage and outputs "1" to a data bus RDATA0.

Subsequently, the set operation SET inputs the address ADD and the write data WDATA0, thereby selecting the word line WL0 and the control signal YSW0. Herein, since the data "0" is written, the write amplifier circuit WAMP0 first supplies the voltage Vreset to the bit line BL0. Vreset has to melt the memory element thus is normally higher than the voltage Vset. After the voltage is applied for a period (Treset) sufficient to melt the memory element, the Vset is then supplied to the bit line BL0. The melted memory element is slowly cooled according to the voltage Vset to be crystallized. Although an optimum temperature for crystallization differs depending on the characteristics of the element, for example, it is about 300° C.

Herein, the temperature of the memory element depends on the power generating itself and an ambient temperature. For example, when the ambient temperature is 150° C., the difference from a crystallization temperature is 150° C., and when the ambient temperature is −50° C., the difference becomes 350° C., which means that the temperature difference is more than doubled. Therefore, power required for gaining the crystalline temperature differs more than double. Thus, when the ambient temperature is high (TH), Vset is decreased to be lower than Vset of room temperature (TR), and when the ambient temperature is low (TL), Vset is increased, thereby maintaining the optimum temperature for crystallization. After the voltage Vset is applied for a period (Tset) sufficient to crystallize the memory element, the word line WL0 is turned OFF, thereby ending the write operation.

Note that, the Vreset is a voltage for melting the element and the melting temperature is very high compared with the ambient temperature as 600° C., for example. Therefore, unlike the Vset, the voltage is not required to be changed depending on the ambient temperature. Further, since the Vreset is normally a high voltage, if this voltage is varied depending on the temperature as disclosed in the conventional art of Patent Document 2, it may be necessary to reinforce the withstand voltage of the MOS transistor instead, for instance. Therefore, the Vreset is preferably not subjected to a temperature correction.

Subsequently, the read operation READ from the memory cell CELL00 selects the word line WL0 and the control signal YSR0 according to the address ADD. Note that, before the word line WL0 is selected, the pre-charge control signal PC0 is changed from "H" to "L", thereby pre-charging the bit line BL0 at the read voltage Vread in advance. Then, the control signal PC0 is changed from "L" to "H", thereby discharging the charge on the bit line BL0 to the ground voltage via the memory cell CELL00. Herein, since the memory element of the memory cell CELL00 is in a set state and its resistance is low as much as 10 kΩ to 1 kΩ, the voltage of the bit line BL0 is decreased. The read amplifier circuit RAMP0 amplifies this voltage and outputs "0" to the data bus RDATA0.

Note that, in FIG. 4, for example, Vreset is 1.5 V, Vset is 1.0 V, and Vread is 0.5 V. However, the voltage of Vset is varied according to the ambient temperature. Further, to significantly increase the operation margin, it is preferable to apply the above-described temperature correction to the set operation in the slow-cooling mode as shown in FIG. 4. However, even when a temperature correction is applied to the set operation as in the current control mode of FIG. 2 in which the temperature is relatively low from the start, effects can be achieved to some extent.

<Power-Supply Circuit System>

Figure 5:
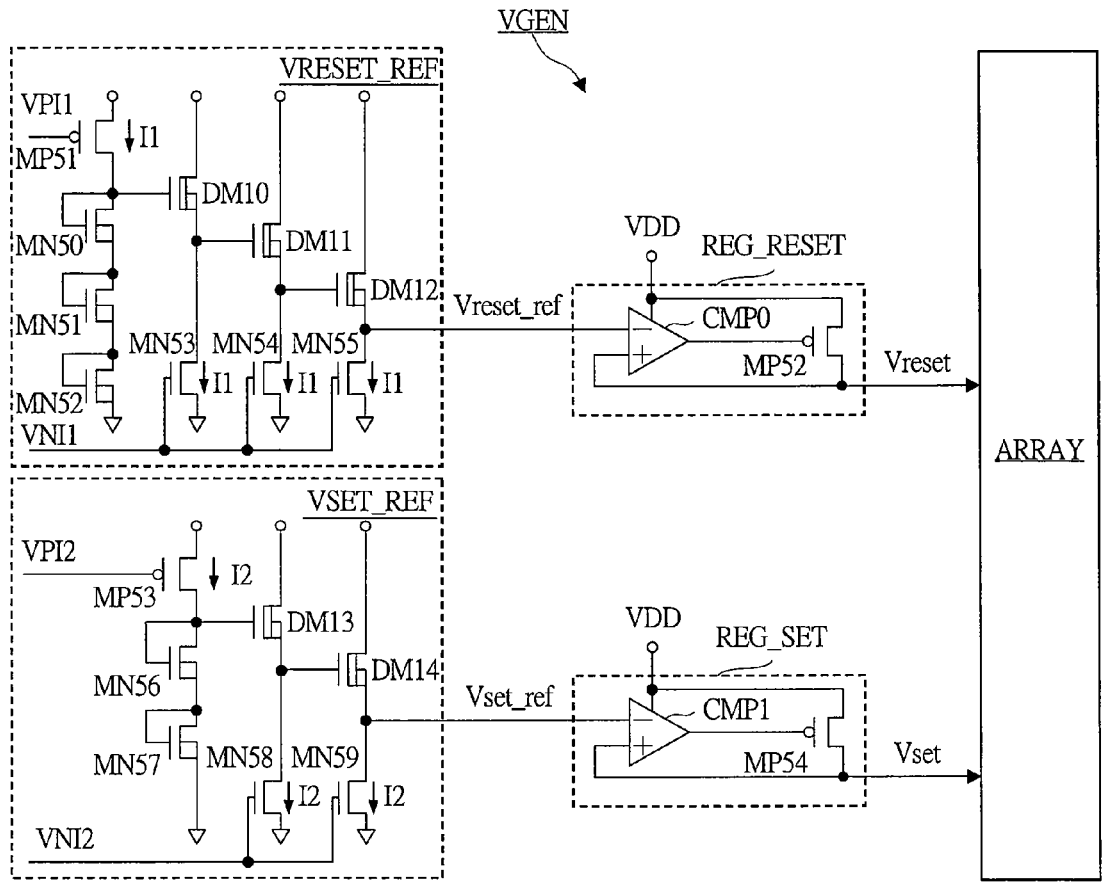
FIG. 5 is a circuit diagram of one example of circuits that generate various voltages for use in the semiconductor device of FIG. 1.

FIG. 5 is a circuit diagram of one example of circuits that generate various voltages for use in the semiconductor device of FIG. 1. In the present embodiment, the voltages have a magnitude relation of VDD>Vreset>Vset>Vread. Herein, a power-supply circuit that generates the reset voltage Vreset and the set voltage Vset from a power-supply voltage VDD is described in detail.

A power-supply circuit VGEN includes, for example, a reset power-supply circuit REG_RESET, a set power-supply circuit REG_SET, a reset-reference-voltage generating circuit VRESET_REF, and a set-reference-voltage generating circuit VSET_REF. The reset power-supply circuit REG_RESET includes a comparator CMP0 and a P-channel MOS transistor MP52. And, a reset reference voltage Vreset_ref and the reset voltage Vreset are compared by the comparator CMP0 and, based on the comparison result, a gate electrode of the P-channel MOS transistor MP52 is controlled, thereby supplying the stable reset voltage Vreset. Similarly, in the set power-supply circuit REG_SET, a set reference voltage Vset_ref and the set voltage Vset are compared by a comparator CMP1 and, based on the comparison result, a gate electrode of a P-channel MOS transistor MP54 is controlled, thereby supplying the stable set voltage Vset.

Figure 7:
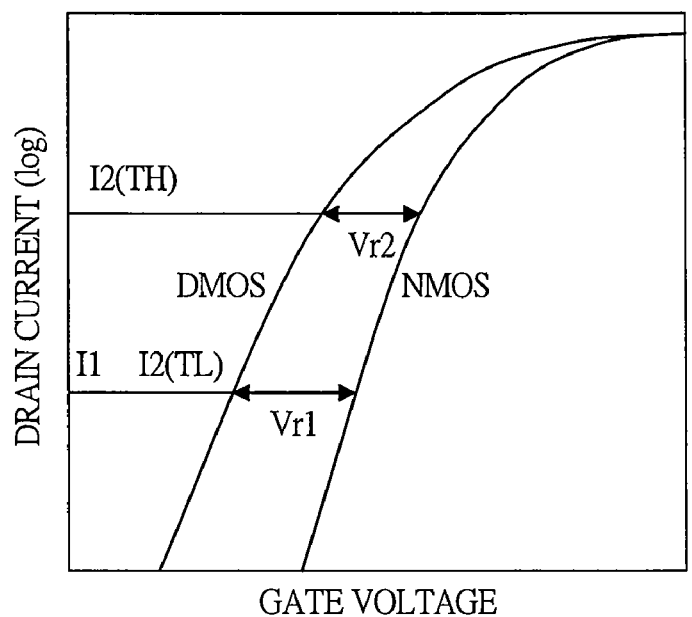
FIG. 7 is a diagram showing characteristics of a transistor used in FIG. 5.

The reset-reference-voltage generating circuit VRESET_REF includes N-channel MOS transistors (MN53, MN54, MN55) and a P-channel MOS transistor MP51 that supply a constant current I1 independent to temperature, and N-channel MOS transistors (MN50, MN51, MN52) and depletion MOS transistors (DM10, DM11, DM12) that generate voltages. Herein, gate-voltage dependency of drain current of the N-channel MOS transistors and the depletion MOS transistors is shown in FIG. 7.

The depletion MOS transistor DMOS has a threshold set lower than that of the N-channel MOS transistor NMOS, and the difference of the gate voltages with the current I1 flowing is Vr1. With these characteristics, the circuit VRESET_REF in FIG. 5 triples this Vr1, and a voltage of tripled Vr1 is outputted to Vreset_ref. Note that, gate electrodes of the N-channel MOS transistors (MN53, MN54, MN55) have connected thereto a signal VNI1 for control so that the current I1 flows, and a gate electrode of the P-channel MOS transistor MP51 has connected thereto a signal VPI1 for control so that the current I1 flows.

The set-reference-voltage generating circuit VSET_REF has a circuit configuration nearly similar to that of the VRESET_REF, but N-channel MOS transistors (MN58, MN59) and a P-channel MOS transistor MP53 are controlled with control signals (VNI2, VPI2), respectively, and N-channel MOS transistors (MN56, MN57) and depletion MOS transistors (DM13, DM14) that generate voltages, so as to supply a current I2 with a temperature characteristic. The current I2 is set, at a high temperature (TH), to have a value larger than that at the time of a low temperature (TL) as shown in FIG. 7. A potential difference in gate electrodes when the current I2 flows through the N-channel MOS transistors and the depletion MOS transistors at the high temperature (TH) is Vr2, and the potential difference has a large value as Vr1 at the low temperature (TL). As a result, to the set reference voltage Vset_ref, a voltage of doubled Vr1 is outputted at the low temperature (TL), and a voltage of doubled Vr2 is outputted at the high temperature (TH).

Figure 6:
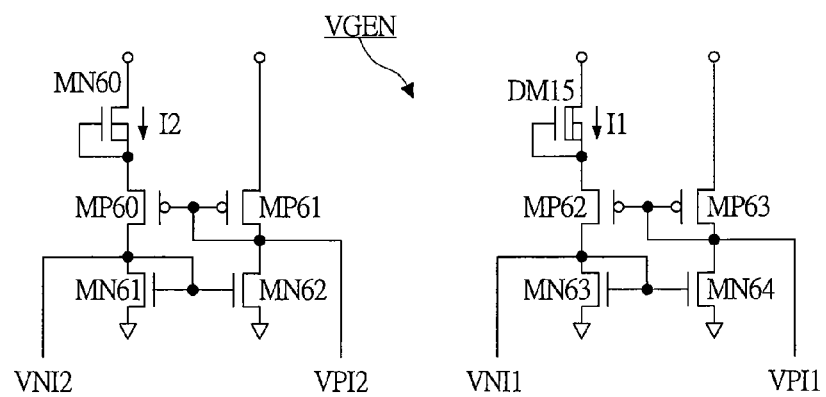
FIG. 6 is a circuit diagram of one example of circuits that generates a control signal in the circuit example of FIG. 5.

FIG. 6 is a circuit diagram showing one example of circuits in the circuit example of FIG. 5 that generate control signals of (VNI1, VPI1, VNI2, VPI2). An N-channel MOS transistor MN60 has a gate length and a gate width set to flow the current I2, and a depletion MOS transistor DM15 has a gate length and a gate width to flow the current I1. Herein, main component of I2 is an OFF current, and main component of I1 is an ON current. Therefore, I2 has a large temperature dependency (has a positive temperature characteristic), but I1 has a small temperature dependency.

And, an N-channel MOS transistors MN63 and MN64 and a P-channel MOS transistor MP63 of FIG. 6 generate the control signals (gate voltages) VNI1 and VPI1 for flowing this current I1 to the circuit of FIG. 5. Similarly, an N-channel MOS transistors MN61 and MN62 and a P-channel MOS transistor MP61 generate the control signals (gate voltages) VNI2 and VPI2 for flowing the current I2.

Figure 8:
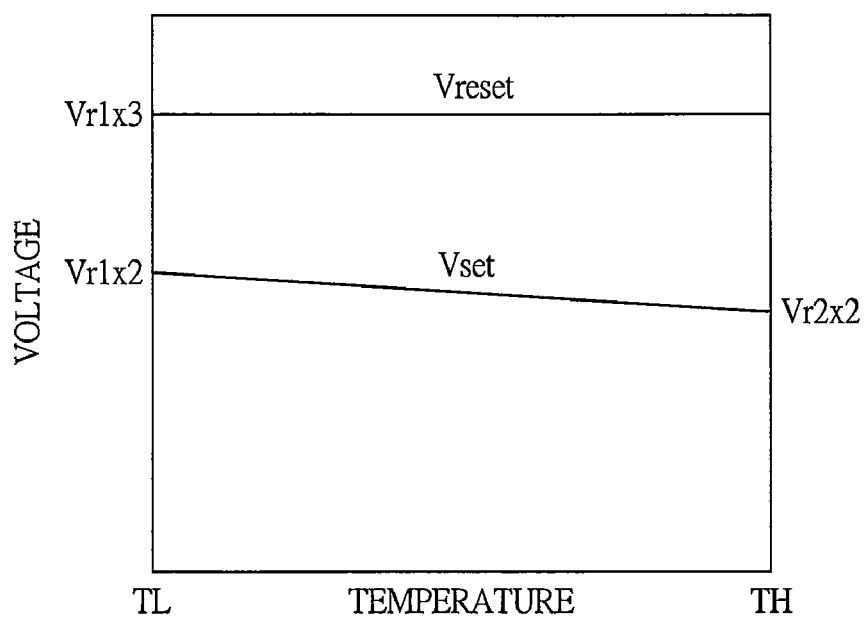
FIG. 8 is a diagram showing voltages generated in a power-supply circuit of FIG. 5.

According to the above-described circuit configuration, as shown in FIG. 8, Vreset is constant (Vr1x3) independent to temperature, and Vset has a small value (Vr1x2, Vr2x2) at high temperatures. Note that, in the present embodiment, the reset power-supply circuit REG_RESET is provided in order to supply stable Vreset. However, Vreset does not require temperature correction, and thus the power-supply voltage VDD can be used. In this manner, no circuit for generating Vreset is required, thereby reducing a circuit area. Further, since Vreset does not require highly-accurate voltage adjustment depending on temperature unlike Vset, a general circuit such as a band-gap reference circuit may be used to generate a reference voltage.

Figure 10:
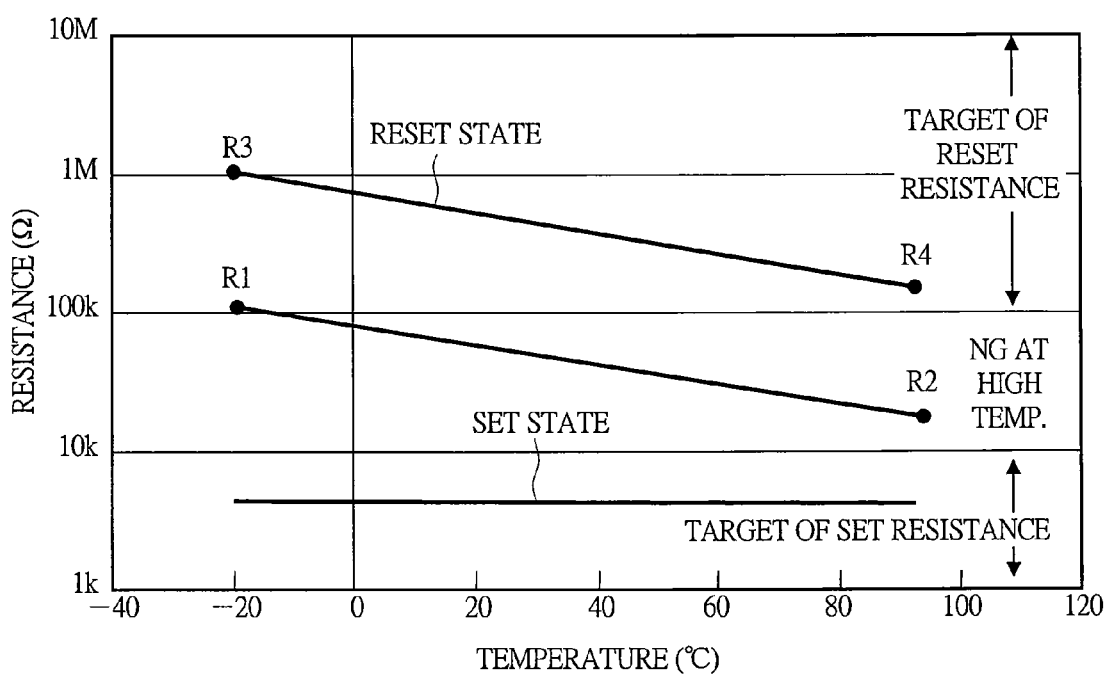
FIG. 10 is a graph showing one example of resistance value and temperature characteristics in respective states of a memory element in the semiconductor device according to the embodiment of the present invention.

Furthermore, as for Vset, as described with reference to FIG. 5 and FIG. 6, a system is taken in which the characteristics of the MOS transistors are used to generate the reference voltage Vset_ref having temperature characteristics (and set voltage Vset). By using this system, an error due to changes with time can be prevented, and a highly-accurate voltage having temperature dependency can be always stably generated. And in this manner, the write operation margin between the set operation and the reset operation can be always stably ensured. On the other hand, in a system of using a resistance value of the phase-change element in the conventional art as disclosed in the Patent Document 2, the resistance value requires temperature dependency, and thus a phase-change element in an amorphous state (reset state) is required to be used as shown in FIG. 10 which will be described below. However, this state is expected to become closer to a crystalline state with time, thus the accuracy may be decreased with time and the operation margin may be reduced.

OTHER EMBODIMENTS

In the configuration example of FIG. 1, in order to achieve enhancement of the operation margin by using the set operation in the slow-cooling mode, as shown in FIG. 4, the system where Vreset is first applied and then Vset is applied, and the temperature correction is performed on this Vset. Herein, a system different from that in FIG. 1 and other drawings for similarly enhancing the operation margin in the slow-cooling mode will be described.

FIG. 9 shows waveform diagrams of various systems in a semiconductor device according to another embodiment of the present invention when a slow-cooling mode is controlled depending on an ambient temperature, in which FIG. 9A to FIG. 9E each shows one example of an operation waveform of each different system.

Figure 9A:
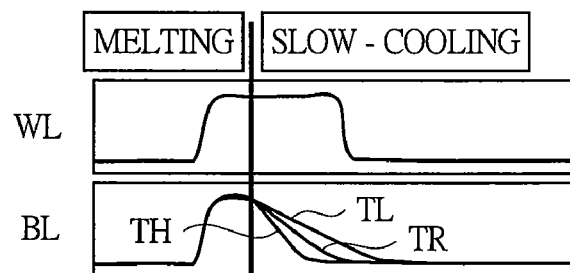
FIG. 9 shows waveform diagrams of various systems in a semiconductor device according to another embodiment of the present invention when a slow-cooling mode is controlled depending on an ambient temperature, in which FIG. 9A to FIG. 9E each shows one example of operation waveform in each different system.
Figure 19:
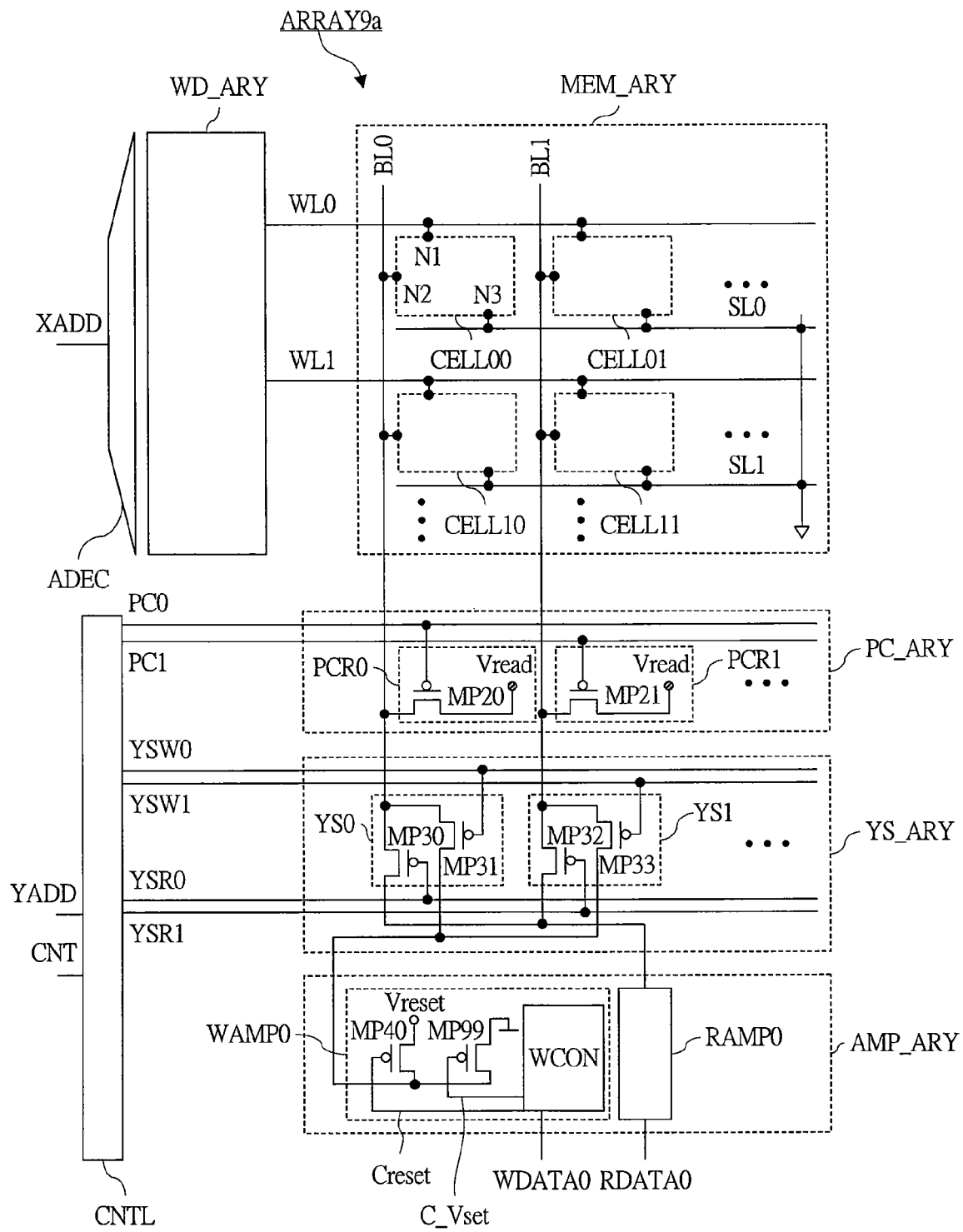
FIG. 19 is a schematic diagram of one example of memory-array configuration to achieve the operation waveform of FIG. 9A.

FIG. 9A shows a system of controlling a falling speed of the bit line BL. By slowing the falling speed when the ambient temperature is at a low temperate (TL) compared to that at a high temperature (TH), a control is performed so that the temperature during crystallization is constant independently of the ambient temperature. This system can be achieved by using a configuration shown in FIG. 19, for example. FIG. 19 is a schematic diagram of one example of a memory-array configuration to achieve the operation waveform of FIG. 9A.

A memory array ARRAY9a shown in FIG. 19 has a configuration different from that of FIG. 1 in the write amplifier circuit WAMP0. In the configuration example of FIG. 19, the voltage (current) of the bit line BL applied by an initial reset is then connected to the ground voltage via a P-channel MOS transistor MP99, so that the voltage (current) is gradually reduced. And, a gate voltage of this MP99 is controlled by a control signal C_Vset having a temperature characteristic as that of Vset. In this manner, as shown in FIG. 9A, the higher the temperature becomes (TH), the faster the voltage (current) of the bit line BL is reduced.

Figure 9B:
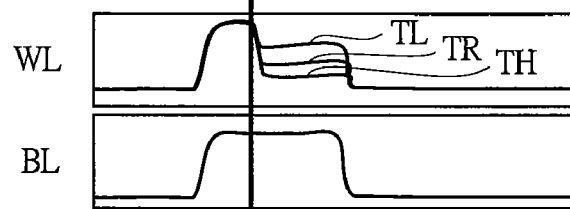
Figure 20:
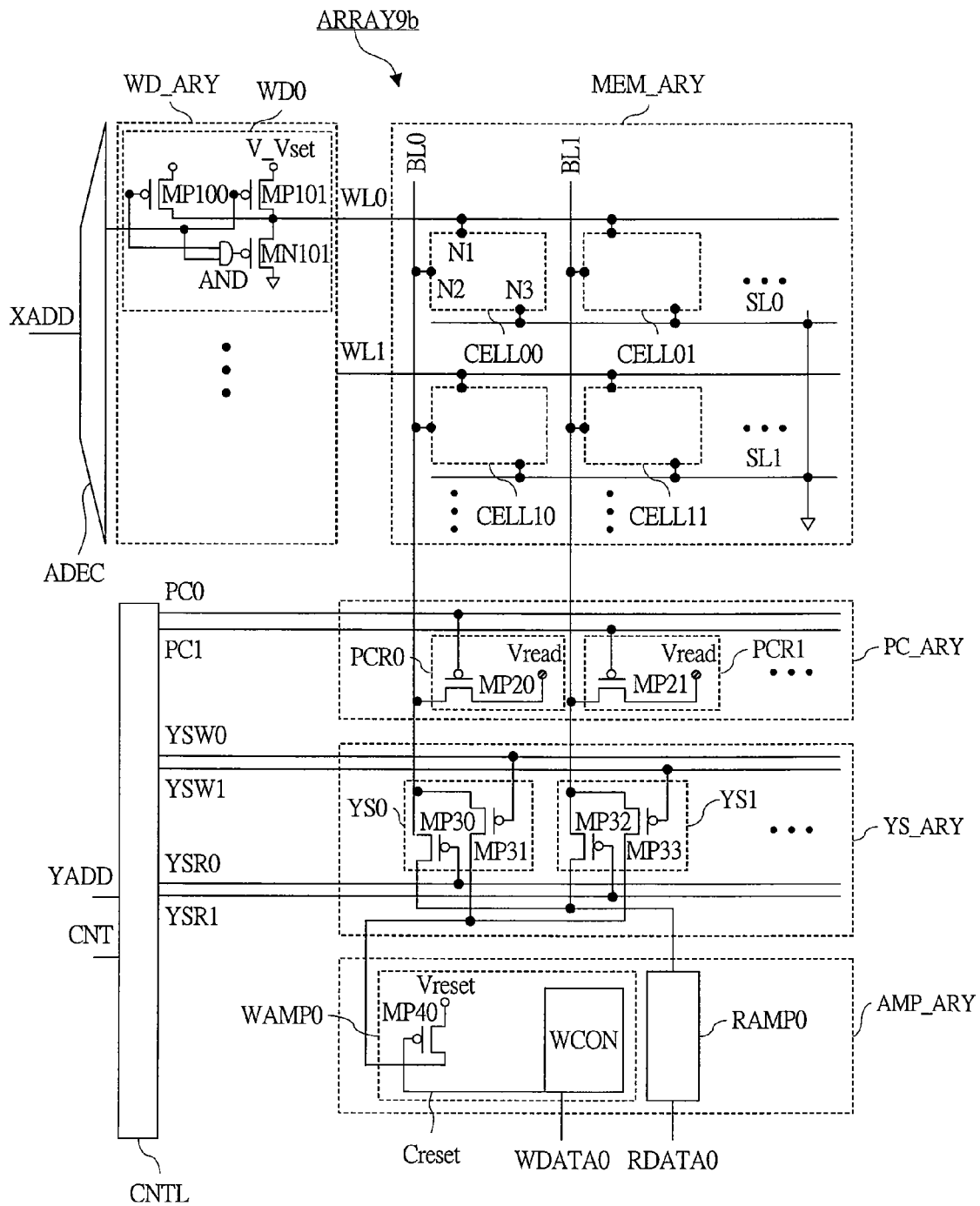
FIG. 20 is a schematic diagram of one example of memory-array configuration to achieve the operation waveform of FIG. 9B.

FIG. 9B shows a system of controlling voltage of the word line. By increasing the voltage when an ambient temperature is a low temperature (TL) compared to that at a high temperature (TH), a control is performed so that the temperature during crystallization is constant independently of the ambient temperature. This system can be achieved by using the configuration shown in FIG. 20, for example. FIG. 20 is a schematic diagram of one example of memory-array configuration to achieve the operation waveform of FIG. 9B.

A memory array ARRAY9*b* shown in FIG. 20 has a configuration different from that of FIG. 1 in the word driver array WD_ARY and the write amplifier circuit WAMP0. In the configuration example of FIG. 20, no MOS transistor to apply Vset is provided in WAMP0, and a word driver WD0 in WD_ARY can generate two stages of voltages. That is, WD0 applies a voltage of the word line WL0 at an initial reset stage via a P-channel MOS transistor MP100, and then applies a voltage of WL0 at a second stage via a P-channel MOS transistor MP101. At this time, a source voltage of the MP101 is a power-supply voltage V_Vset having a temperature characteristic similar to that of Vset. In this manner, as shown in FIG. 9B, the higher the temperature is, the lower the voltage applied is.

Figure 9C:
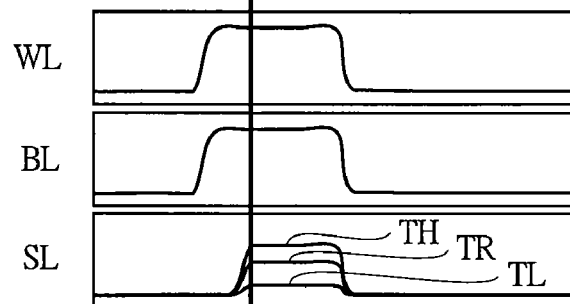
Figure 21:
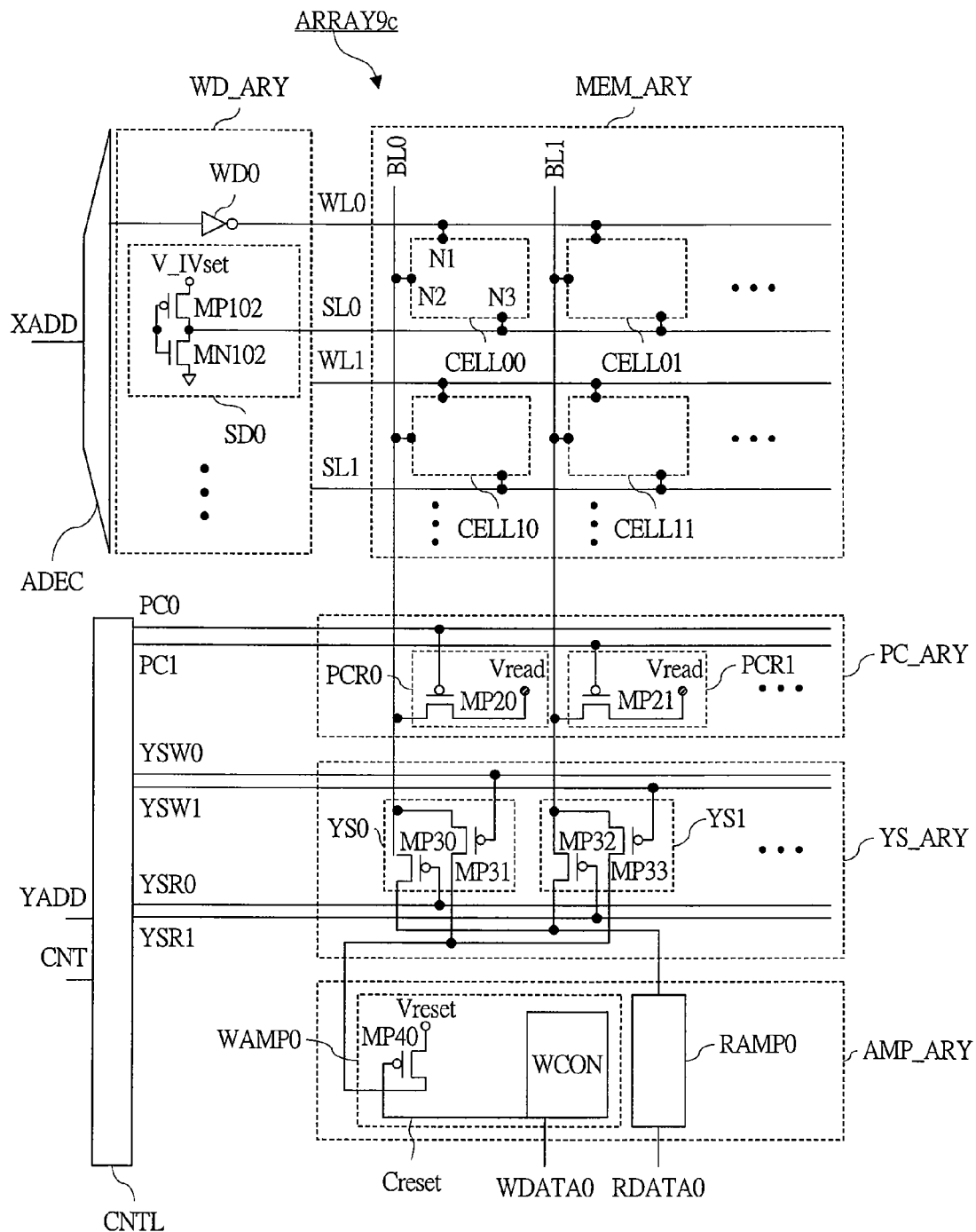
FIG. 21 is a schematic diagram of one example of memory-array configuration to achieve the operation waveform of FIG. 9C.

FIG. 9C shows a system of controlling voltage of the source line SL. By decreasing the voltage at an ambient temperature of low temperature (TL) compared to that at a high temperature (TH), a control is performed so that the temperature during crystallization is constant independently of the ambient temperature. This system can be achieved by using the configuration shown in FIG. 21, for example. FIG. 21 is a schematic diagram of one example of memory-array configuration to achieve the operation waveform of FIG. 9C.

A memory array ARRAY9*c* shown in FIG. 21 has a configuration different from that of FIG. 1 in the word driver array WD_ARY and the write amplifier circuit WAMP0. In the configuration example of FIG. 21, no MOS transistor to apply Vset is provided in WAMP0, and a word driver WD0 formed of an inverter circuit and a source driver SD0 are provided in WD_ARY. This SD0 has a configuration in which a power-supply voltage V_IVset having a temperature characteristic opposite to that of Vset described with reference to FIG. 8 and other drawings is output to a source line SL0. In this manner, the higher the temperature is, the higher the voltage applied to the source line SL is as shown in FIG. 9C.

Figure 9D:
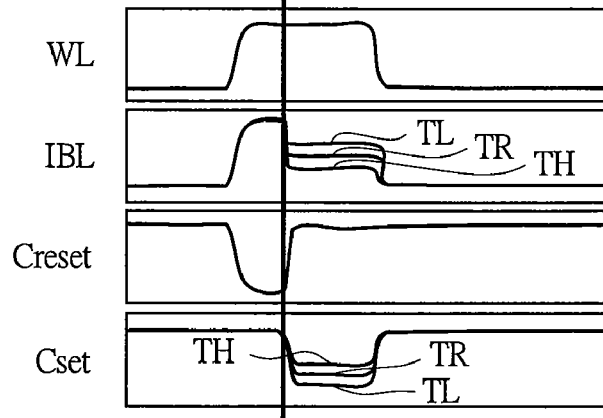

FIG. 9D shows a system of controlling current to feed through the element. By decreasing a voltage of control signal Cset at an ambient temperature of low temperature (TL) compared to that at a high temperature (TH), a current IBL flowing through the bit line is increased, and a control is performed so that the temperature during crystallization is constant independently of the ambient temperature. This system can be achieved by using a configuration similar to that shown in FIG. 1, for example. That is, in FIG. 1, it is only necessary to take the voltage of the control signal Cset as a voltage having a temperature characteristic opposite to that of Vset described with reference to FIG. 8 and other drawings.

Figure 9E:
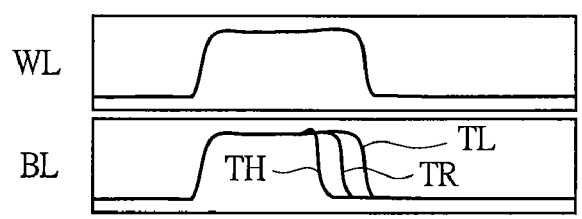
Figure 22:
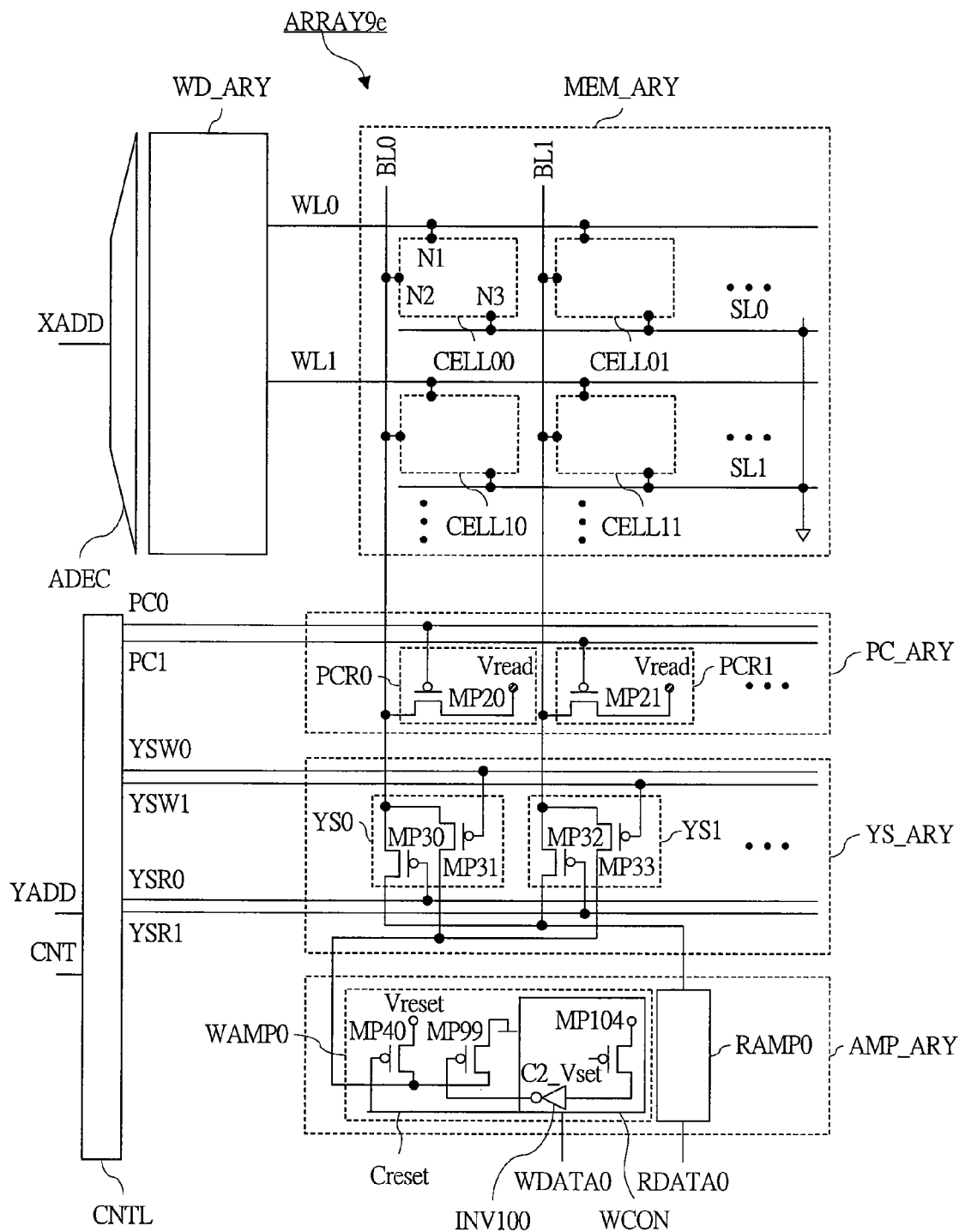
FIG. 22 is a schematic diagram of one example of memory-array configuration to achieve the operation waveform of FIG. 9E.

FIG. 9E shows a system of increasing a melting time for heating the periphery of the element so that its residual heat crystallizes the melted element. By increasing the pulse width at an ambient temperature of low temperature (TL) compared to that at the high temperature (TH), thereby heating the periphery of the element, a control is performed so that the temperature during crystallization after pulse application is constant independently of the ambient temperature. This system can be achieved by using a configuration shown in FIG. 22, for example. FIG. 22 is a schematic diagram of one example of memory-array configuration to achieve the operation waveform of FIG. 9E.

A memory array ARRAY9*e* shown in FIG. 22 has a configuration different from that of FIG. 1 in the write amplifier circuit WAMP0. In the configuration example of FIG. 22, the voltage (current) of the bit line BL first applied via the P-channel MOS transistor MP40 is then connected to the ground voltage via the P-channel MOS transistor MP99, thereby rapidly reducing the voltage (current). The gate voltage of MP99 is then driven by an inverter circuit INV100 in the control circuit WCON. Further, the input of this INV100 is input by the P-channel MOS transistor MP104, and the gate of this MP104 is driven by a control voltage C2_Vset having a temperature characteristic similar to that of Vset. In this manner, the input of INV100 receives an input of an "H" signal having a positive temperature characteristic, and therefore, the higher the temperature is, the faster a speed of switching to "L" of the INV100 is. Therefore, as shown in FIG. 9E, the higher the temperature is, the faster reduction of the voltage (current) of the bit line BL can be.

<Reading System in Consideration of Temperature Characteristics of Resistance of the Phase-change Element>

FIG. 10 is a graph showing one example of resistance value and temperature characteristic in each state of a memory element in the semiconductor device according to the embodiment of the present invention. The resistance value of the phase-change element serving as the memory element has a temperature dependency. In the example shown in FIG. 10, that the resistance value in the reset state has a temperature dependency of one-digit/100° C. On the other hand, the resistance value in the set state has little temperature dependency. It is assumed herein that a target value of the reset resistance is, for example, equal to or larger than 100 kΩ and a target value of the set resistance is equal to or smaller than 10 kΩ.

For example, consider a case where a reset writing is performed at a low temperature (for example, −20° C.) and the resistance value of an element is 1 MΩ (R3) and the resistance value of another element is 100 kΩ (R1) due to variations in writing. In both of the elements, the resistance value reaches the target value of reset resistance. However, due to the temperature characteristic of the elements, the resistance values of the elements having R1 and R3 will be decreased when the elements become at a high temperature (TH) (e.g., 95° C.). In that case, the resistance value of the element having R3 becomes R4 which is closer to 100 kΩ. R4 is within the range of target value, thereby posing no problem. However, the resistance value of the element having R1 becomes R2 which is smaller than 100 kΩ, thereby falling outside the range of target value (NG AT HIGH TEMP.).

To solve this problem, it is necessary to perform writing so that the resistance is R3 at any temperature, that is, the resistance becomes larger than 1 MΩ. In this manner, the resistance value is always equal to or larger than 100 kΩ even at the high temperature (TH), thereby achieving the target. However, the element having the resistance value of 1 MΩ at the high temperature (TH) has a resistance value of 10 MΩ at the low temperature (TL), and therefore significantly excessive writing may be performed compared with the case where the resistance value is 1 MΩ at the low temperature (TL).

Consequently, a new system has been devised. This is a system in which a target value of the resistance value for writing at the low temperature (TL) is equal to or larger than 1 MΩ and a target value thereof at the high temperature (TH) is 100 kΩ. With this system, the resistance value of the element subjected to writing at the low temperature becomes equal to or larger than 100 kΩ at the high temperature, thereby becoming a target resistance value. The resistance of the element subjected to writing at the high temperature (TH) is further increased to be equal to or larger than 100 kΩ, thereby becoming a target resistance value.

To achieve such writing, it is important to perform verification whether such writing has been completed. When the temperature is high (TH) at the time of verification, it is checked whether the resistance is equal to or larger than 100 kΩ. When the temperature is low (TL), it is checked whether the resistance is equal to or larger than 1 MΩ. If the resistance does not reach the target, writing is again performed with a changed write condition. A memory array for achieving the above is shown in FIG. 11.

Figure 11:
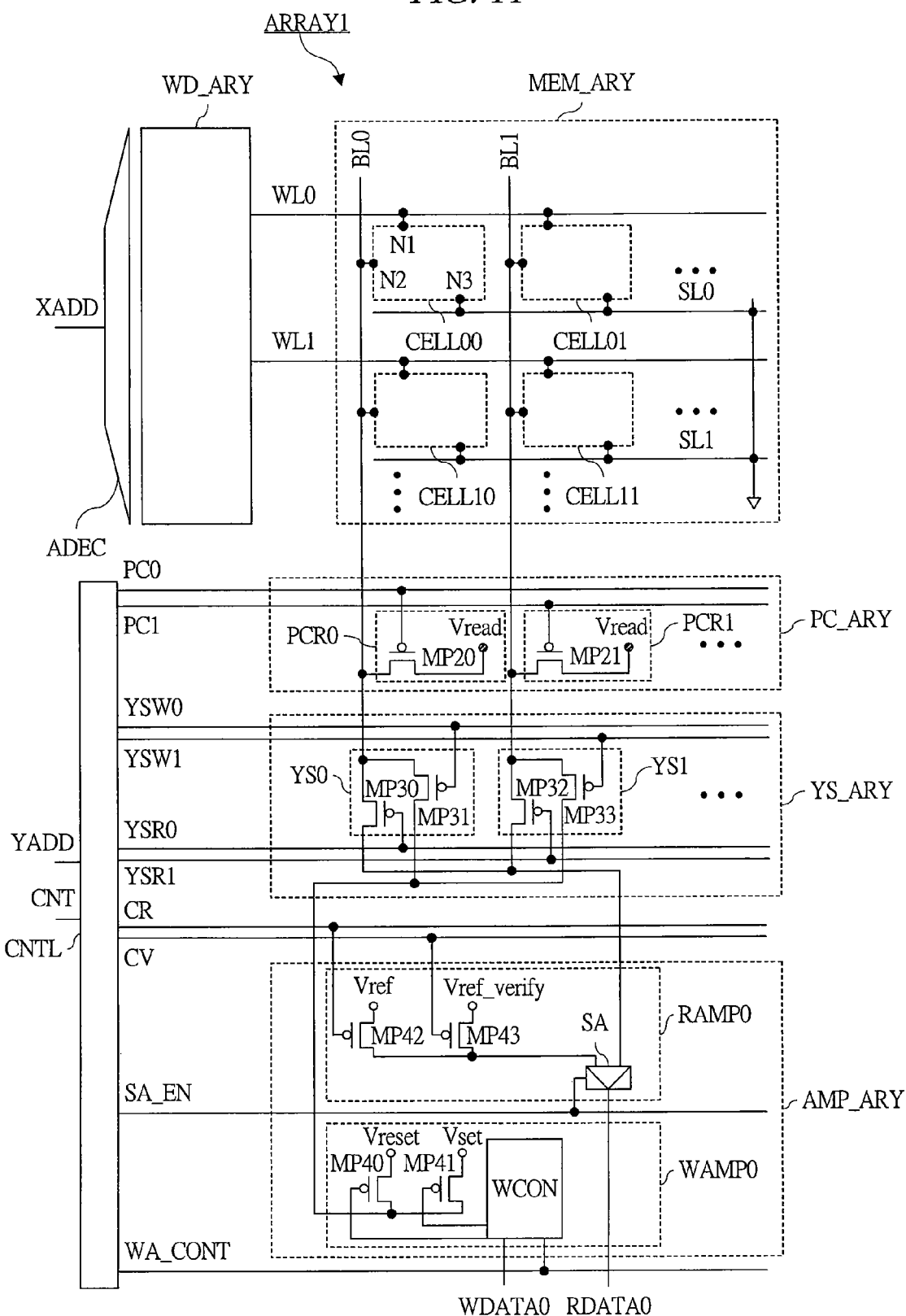
FIG. 11 is a schematic view of one example of a memory-array configuration in a semiconductor device according to still another embodiment of the present invention.

FIG. 11 is a schematic diagram of another example of memory-array configuration in a semiconductor device according to still another embodiment of the present invention. A memory array ARRY1 shown in FIG. 11 has a configuration in which an example of the read amplifier circuit RAMP with respect to FIG. 1 is described in detail. The read amplifier circuit RAMP0 includes a sense amplifier circuit SA and P-channel MOS transistors (MP42, MP43). The P-channel MOS transistor MP42 is a transistor that supplies a reference voltage Vref to the sense amplifier circuit SA at the time of normal reading and is controlled with a control signal CR. The P-channel MOS transistor MP43 is a transistor that supplies a reference voltage Vref_verify to the sense amplifier circuit SA at the time of verification and is controlled with a control signal CV. A sense-amplifier activation signal SA_EN is connected to the sense amplifier circuit SA.

<Operation System>

Figure 12:
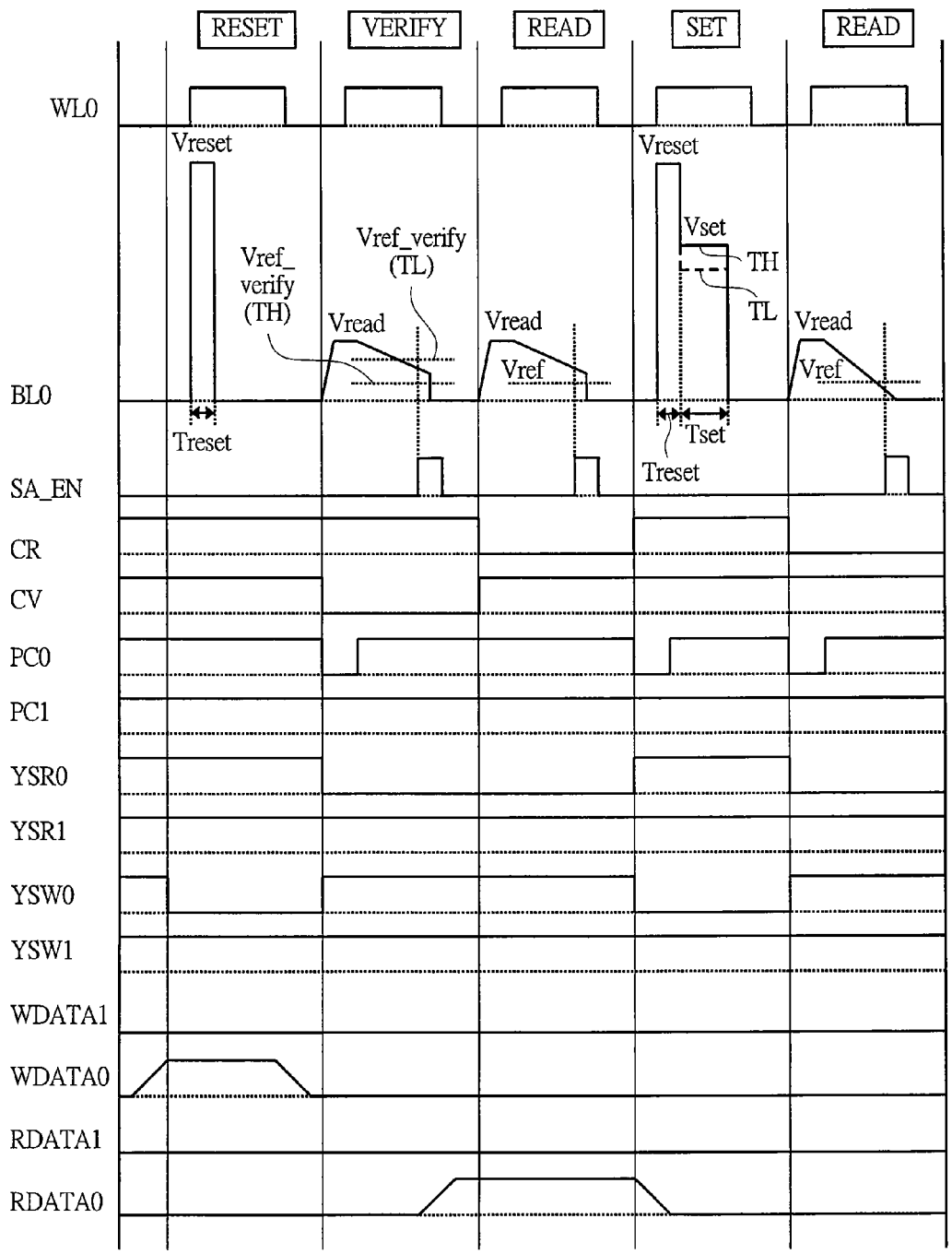
FIG. 12 is a waveform diagram of one example of operation in the semiconductor device of FIG. 11.

FIG. 12 is a waveform diagram of one example of operation in the semiconductor device of FIG. 11. Since the reset operation and the set operation are identical to those in FIG. 4, a verify operation VERIFY and a read operation READ are described in detail. In FIG. 12, it is described that data "1" is written in the memory cell CELL00, then a verify is performed, a normal reading is further performed, data "0" is further written, and then normal reading is performed. The data "1" means resetting the phase-change element and making the resistance value at 100 kΩ to 1 MΩ. The data "0" means setting the phase-change element and making the resistance value at 1 kΩ to 10 kΩ.

First, after the word line WL0 and a control signal YSW0 are selected according to an address ADD to perform a reset operation, the same word line WL0 and a control signal YSR0 are selected to verify the value written in the memory cell CELL00. At the time of performing this verification, before the word line WL0 is selected, the pre-charge control signal PC0 is changed from "H" to "L", and the bit line BL0 is pre-charged in advance at a read voltage Vread. Then, the control signal PC0 is changed from "L" to "H", so that the charge of the bit line BL0 is discharged to the ground voltage via the memory cell CELL00.

Herein, the memory element of the memory cell CELL00 is in a reset state. Therefore, at the time of the high temperature (TH), the resistance equal to or larger than 100 kΩ will suffice. A reference voltage Vref_verify (TH) capable of detecting this value is then supplied to the sense amplifier circuit SA, and the sense amplifier circuit SA is activated by the amplifier activation signal SA_EN. As shown in FIG. 12, when the potential of the bit line BL0 is higher than the reference voltage Vref_verify (TH), this means that the reset operation has been correctly performed. In this case, data "1" amplified by the SA is outputted to the RDATA0 and, with that value, it is determined that the verify operation has been completed.

On the other hand, at the time of the low temperature (TL), the resistance is required to be on the order of 1 MΩ, and Vref_verify (TL) higher than Vref_verify (TH) is supplied to the sense amplifier circuit SA as a reference voltage. Although not shown, when the potential of the bit line BL0 is higher than the reference voltage Vref_verify (TL), this means that the reset operation has been correctly performed. FIG. 12 shows that the potential of the bit line BL0 is lower than the reference voltage Vref_verify (TL), this means that the reset operation has not correctly performed. When the reset is not correctly performed, the reset operation is again performed with a changed condition.

In this manner, by setting the reference voltage high at the low temperature, the target resistance values at respective temperatures can be achieved. And consequently, the operation margin for each temperature can be ensured.

Next, the normal read operation will be described. Before the word line WL is selected, the pre-charge control signal PC0 is changed from "H" to "L" so that the bit line BL0 is pre-charged in advance at the read voltage Vread. Then, the control signal PC0 is changed from "L" to "H" so that the charge of the bit line BL0 is discharged to the ground voltage via the memory cell CELL00. Here, the memory element of the memory cell CELL00 is in a reset state. And, as a reference voltage, Vref independent from the ambient temperature is supplied to the sense amplifier circuit SA. In this case, since the potential of the bit line BL0 is higher than Vref, this potential difference is amplified, and data "1" is outputted to RDARA0. Note that, in this read operation, since the resistance value is adjusted in advance by the above-described verify operation, reliable read data can be obtained independently of temperature.

Next, the set operation SET is performed, and then a read operation is performed. Herein, before the word line WL is selected, the pre-charge signal PC0 is changed from "H" to "L", so that the bit line BL0 is pre-charged in advance at the read voltage Vread. Then, the control signal PC0 is changed from "L" to "H", so that the charge of the bit line BL0 is discharged to the ground voltage via the memory cell CELL00. The memory element of the memory cell CELL00 is in the set state, and the reference voltage Vref independent of the ambient temperature is supplied to the sense amplifier circuit SA. In this case, since the voltage of the bit line BL0 is lower than Vref, this potential difference is amplified and data "0" is outputted to RDARA0. Note that, since the resistance value in the set state has little temperature dependency, even if a verify operation is not particularly performed, reliable read data can be obtained independently of temperature.

<Power-Supply Circuit System>

Figure 13:
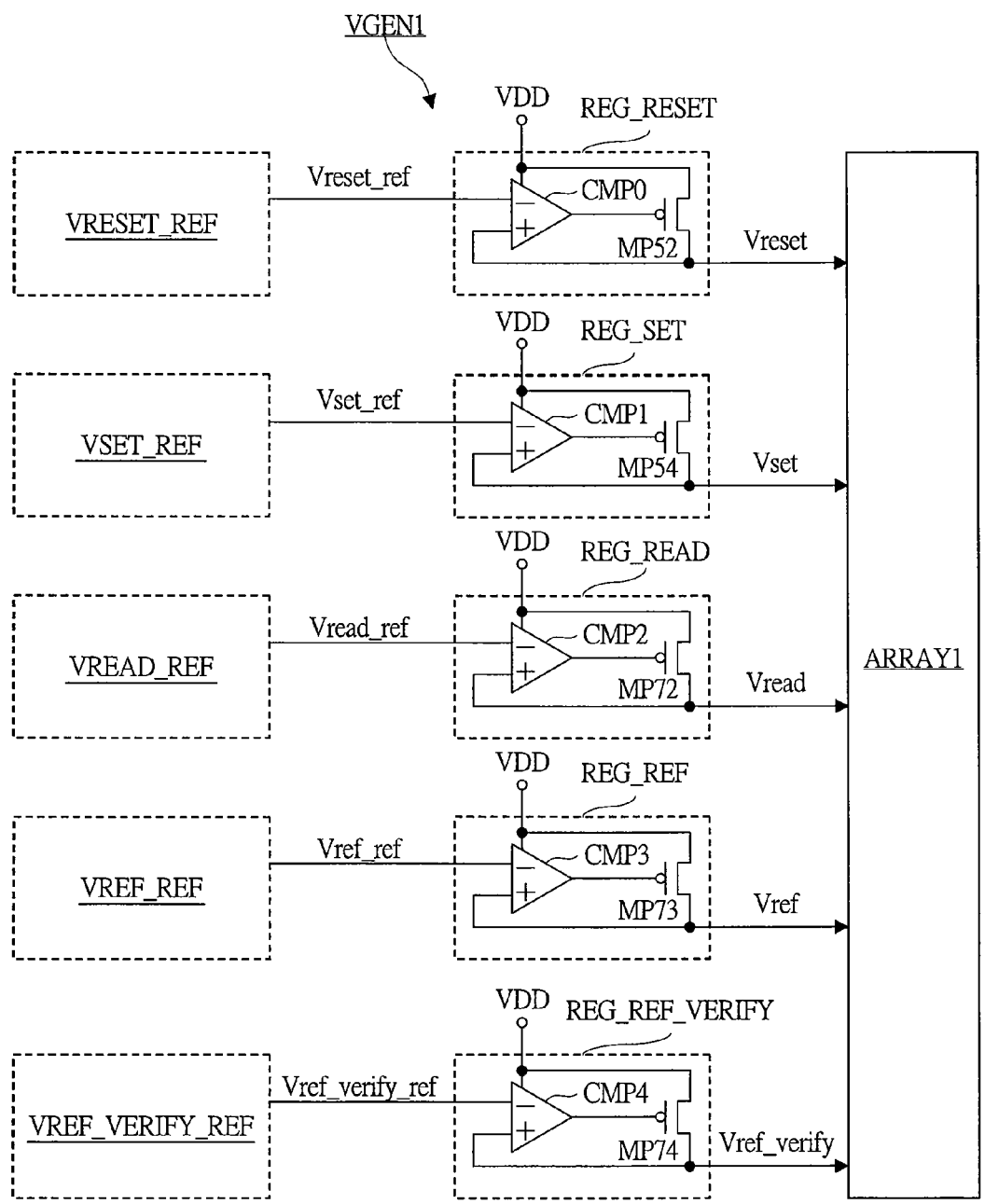
FIG. 13 is a circuit diagram of one example of circuits that generate various voltages for use in the semiconductor device of FIG. 11.

FIG. 13 is a circuit diagram of one example of circuits that generate various voltages for use in the semiconductor device of FIG. 11. In the present embodiment, the voltages have a magnitude relation of VDD>Vreset>Vset>Vread>Vref. A power-supply circuit VGEN1 shown in FIG. 13 includes, in addition to the components of the power-supply circuit VGEN of FIG. 5, a read power-supply circuit REG_READ, a reference power-supply circuit REG_REF, a reference power-supply circuit for verification REG_REF_VERIFY, a read reference-voltage generating circuit VREAD_REF, a reference reference-voltage generating circuit VREF_REF, and a reference reference-voltage generating circuit for verification VREF_VERIFY_REF.

The read power-supply circuit REG_READ includes a comparator CMP2 and a P-channel MOS transistor MP72, and supplies the read voltage Vread based on the read reference voltage Vread_ref. The reference reference-power-supply circuit REG_REF includes a comparator CMP3 and a P-channel MOS transistor MP73, and supplies the reference voltage Vref based on a reference reference-voltage Vref_ref. The reference power-supply circuit for verification REG_REF_VERIFY includes a comparator CMP4 and a P-channel MOS transistor MP74, and supplies the reference voltage for verification Vref_verify based on a reference reference-voltage for verification Vref_verify_ref.

Figure 14:
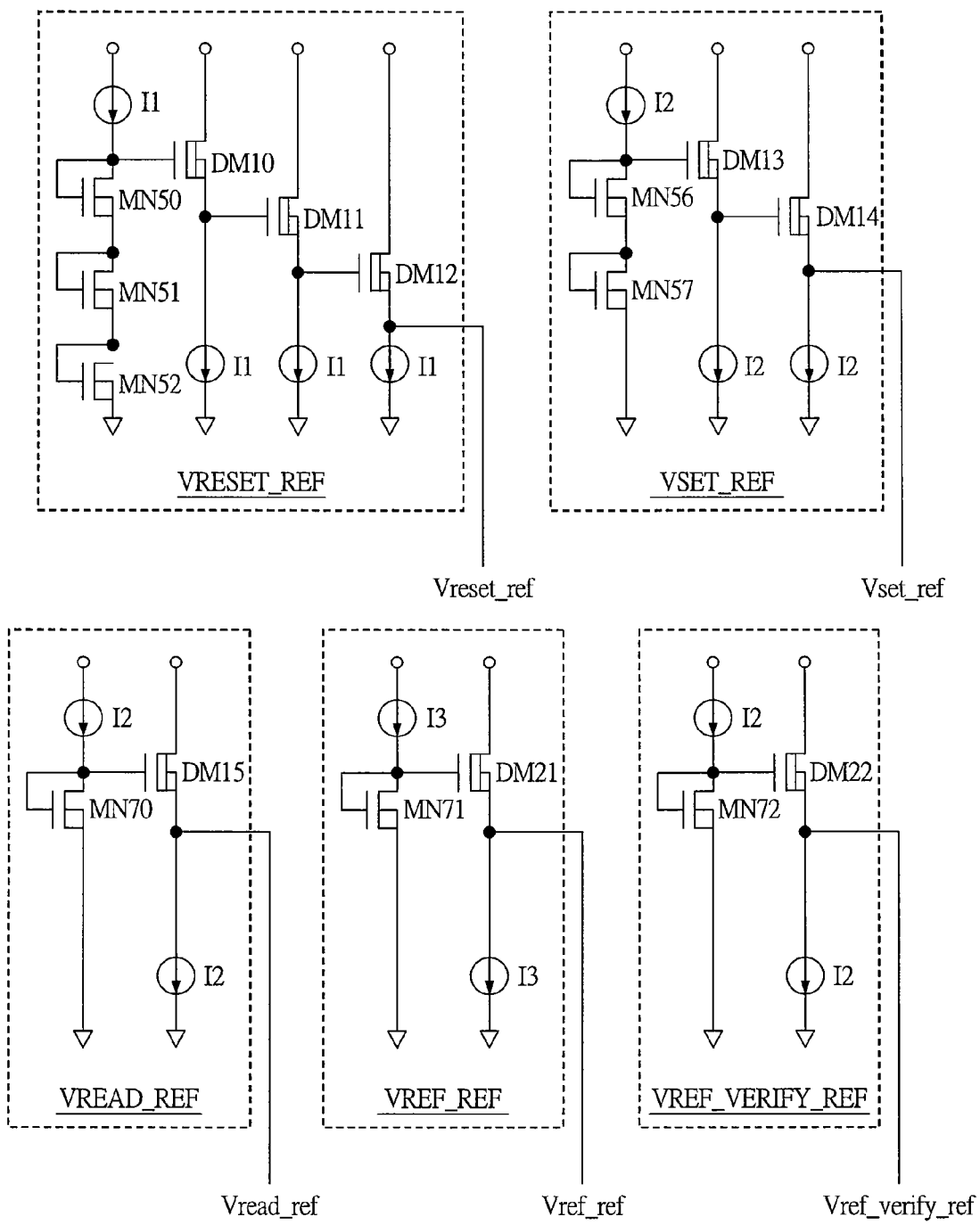
FIG. 14 is a circuit diagram of one example of configurations of respective reference-voltage generating circuits in a power-supply circuit of FIG. 13.
Figure 15A:
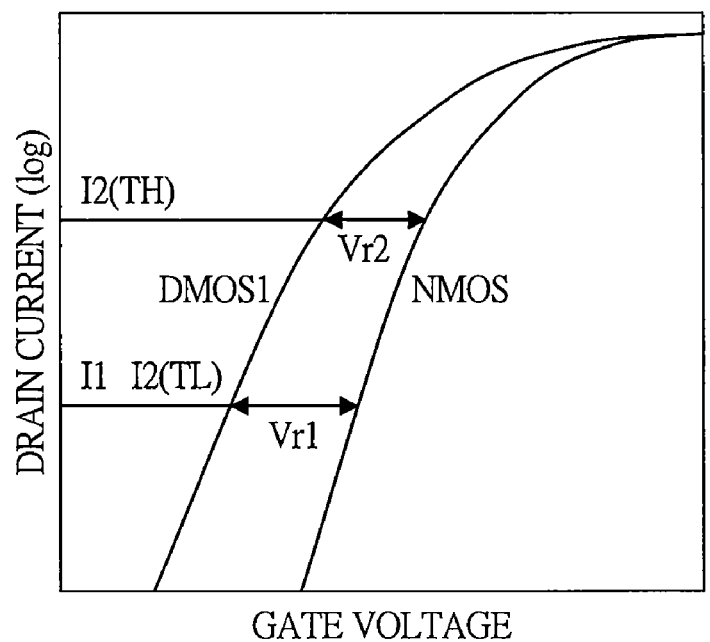
FIG. 15 shows diagrams for showing characteristics of transistors used in FIG. 14.

FIG. 14 is a circuit diagram of one example of configurations of respective reference-voltage generating circuits in the power-supply circuits of FIG. 13. The reset reference voltage generating circuit VRESET_REF includes a current source that supplies a current I1 independent from temperature, N-channel MOS transistors (MN50, MN51, MN52) that generate voltages, and depletion MOS transistors (DM10, DM11, DM12). The gate-voltage dependencies of the drain current of the N-channel MOS transistors and the depletion MOS transistors are shown in FIG. 15A. A depletion MOS transistor DMOS1 has a threshold set lower than that of the N-channel MOS transistor NMOS, and the difference of the gate voltage when the current I1 flows is Vr1. VRESET_REF is a circuit that triples Vr1, and a voltage obtained by tripling Vr1 is outputted to Vreset_ref.

The set reference-voltage generating circuit VSET_REF includes a current source that supplies a current I2 having a positive temperature characteristic, N-channel MOS transistors (MN56, MN57) that generate voltages, and depletion MOS transistors (DM13, DM14). The gate-voltage dependencies of the drain current of the N-channel MOS transistors and the depletion MOS transistors are shown in FIG. 15A. The depletion MOS transistor DMOS1 has a threshold set lower than that of the N-channel MOS transistor NMOS, and the difference of the gate voltage when the current I2 flows is Vr1 at the low temperature (TL) and Vr2 at the high temperature (VH). VSET_REF is a circuit that doubles Vr1 or Vr2, and a voltage obtained by doubling Vr1 is outputted at the low temperature (TL), and a voltage obtained by doubling Vr2 is outputted at the high temperature (TH).

The read reference-voltage generating circuit VREAD_REF includes a current source that supplies the current I2 having a positive temperature characteristic, an N-channel MOS transistor MN70 that generates a voltage, and the depletion MOS transistor DM15. The gate-voltage dependencies of the drain current of the N-channel MOS transistor and the depletion MOS transistor are shown in FIG. 15A. The depletion MOS transistor DMOS1 has a threshold set lower than that of the N-channel MOS transistor NMOS, and the difference of the gate voltage when the current I2 flows is Vr1 at the low temperature (TL) and Vr2 at the high temperature (VH). VREAD_REF is a circuit that multiplies Vr1 or Vr2 by one, and a voltage obtained by multiplying Vr1 by one is outputted to Vread_ref at the low temperature (TL), and a voltage obtained by multiplying Vr2 by one is outputted at the high temperature (TH).

Figure 15B:
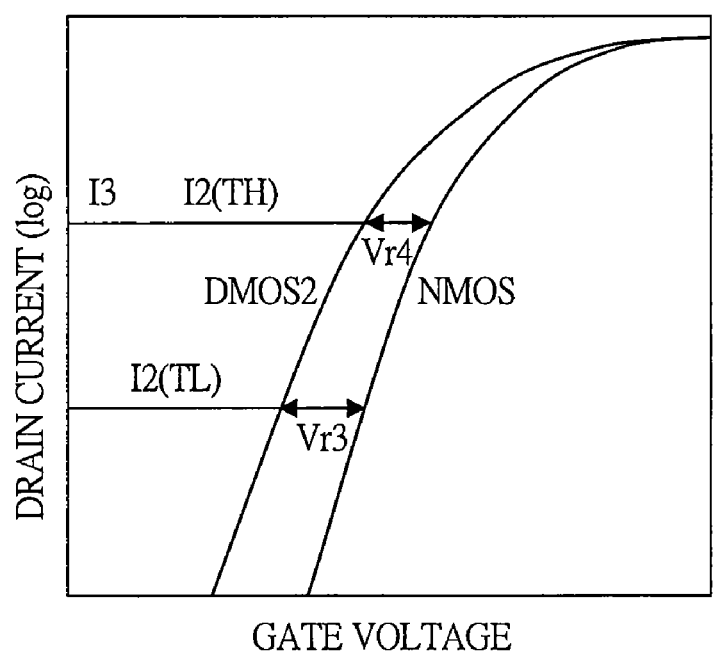

The reference reference-voltage generating circuit VREF_REF includes a current source that supplies a current I3 independent from temperature, an N-channel MOS transistor MN71 that generates a voltage, and a depletion MOS transistor DM21. The gate-voltage dependency of the drain current of the N-channel MOS transistor and the depletion MOS transistor is shown in FIG. 15B. A depletion MOS transistor DMOS2 has a threshold set lower than that of the N-channel MOS transistor NMOS, and the difference of the gate voltage when the current I3 flows is Vr4. VREF_REF is a circuit that multiples Vr4 by one, and a voltage obtained by multiplying Vr4 by one is outputted to Vref_ref.

The reference reference-voltage generating circuit for verification VREF_VERIFY_REF includes a current source that supplies the current I2 having a positive temperature characteristic, an N-channel MOS transistor MN72 that generates a voltage, and a depletion MOS transistor DM22. The gate-voltage dependencies of the drain current of the N-channel MOS transistor and the depletion MOS transistor are shown in FIG. 15B. The depletion MOS transistor DMOS2 has a threshold set lower than that of the N-channel MOS transistor NMOS, and the difference of the gate voltage when the current I2 flows is Vr3 at the low temperature (TL) and Vr4 at the high temperature (VH). VREF_VERIFY_REF is a circuit that multiplies Vr3 or Vr4 by one, and a voltage obtained by multiplying Vr3 by one is outputted to Vref_verify_ref at the low temperature (TL), and a voltage obtained by multiplying Vr4 by one is output at the high temperature (TH).

Figure 16:
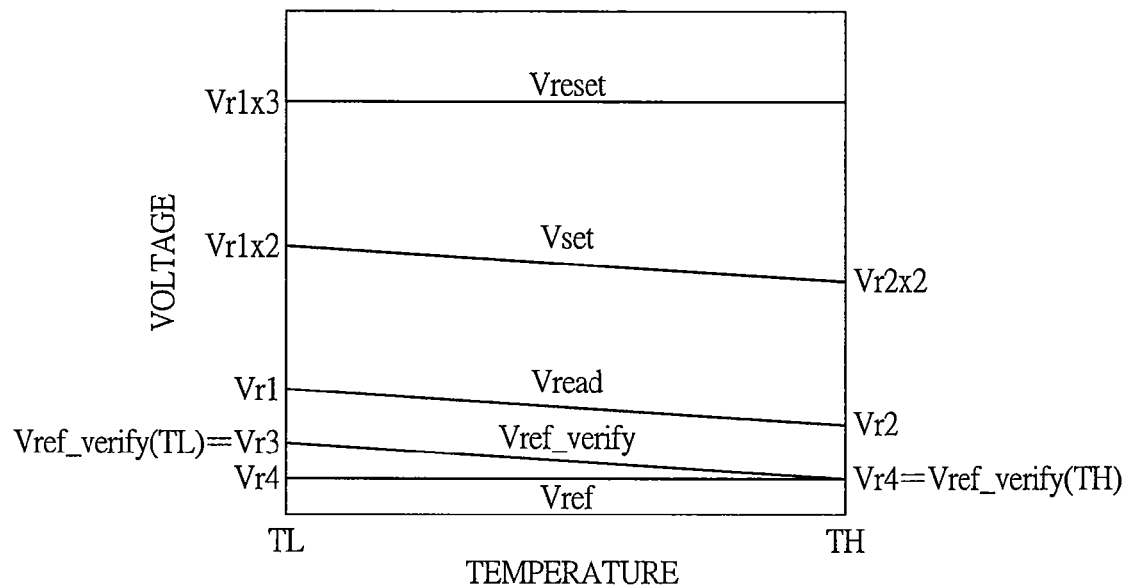
FIG. 16 is a diagram showing voltages generated in the power-supply circuit of FIG. 13.

According to the above-described circuit configuration, as shown in FIG. 16, Vreset and Vref are constant independently of temperature (Vr1x3 and Vr4, respectively), and Vset, Vread and Vref_verify have a small value (Vr1x2 and Vr2X2, Vr1, and Vr3 and Vr4, respectively) at high temperatures. Note that, as with the configuration of FIG. 5, since Vreset does not require temperature correction, the power-supply voltage VDD can be used.

Figure 17:
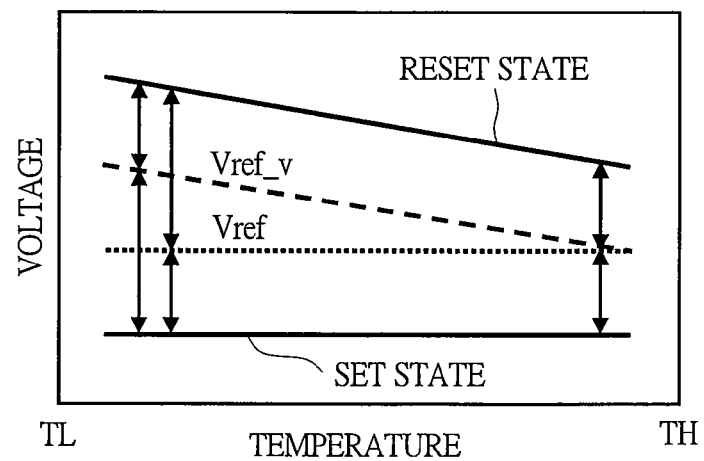
FIG. 17 is an explanatory diagram of a margin of a read operation in the semiconductor device of FIG. 11.

And, as for Vref, a temperature correction is not preferably performed, thereby ensuring the operation margin. FIG. 17 is an explanatory diagram of the margin of read operation in the semiconductor device of FIG. 11. As shown in FIG. 17, it can be assumed that, with the change of resistance value described with reference to FIG. 10, the read voltage of the reset state is decreased along with the temperature increase, whilst the read voltage of the set state is constant independently of temperature. Herein, for example, if Vref is subjected to a temperature correction as disclosed in the Patent Document 2 of the conventional art, the read determination level becomes as Vref_v in FIG. 17, and the read operation margin from the reset state seems to be kept constant at both of the low temperature (TL) and the high temperature (TH).

However, as described above, the reset state (amorphous state) cannot be a stable state, and therefore the margin of the read operation is expected to be decreased with time. For this reason, it is preferable to always ensure a large margin from the reset state. Thus, when the read determination level is made constant independently of temperature as Vref in FIG. 17, a large margin from the reset state can be ensured. Also, since the margin from the set state can be kept constant irrespectively of temperature, a stable read operation can be performed.

Note that, in the present embodiment, Vread is also subjected to temperature correction. This is because the resistance of the reset element is decreased when the ambient air is at a high temperature, thereby increasing a flowing current, and the temperature of the element tends to be increased due to the high temperature of the ambient air and so the possibility of crystallization of the element is increased. Thus, it is made that the voltage is decreased as the temperature is increased.

Figure 18:
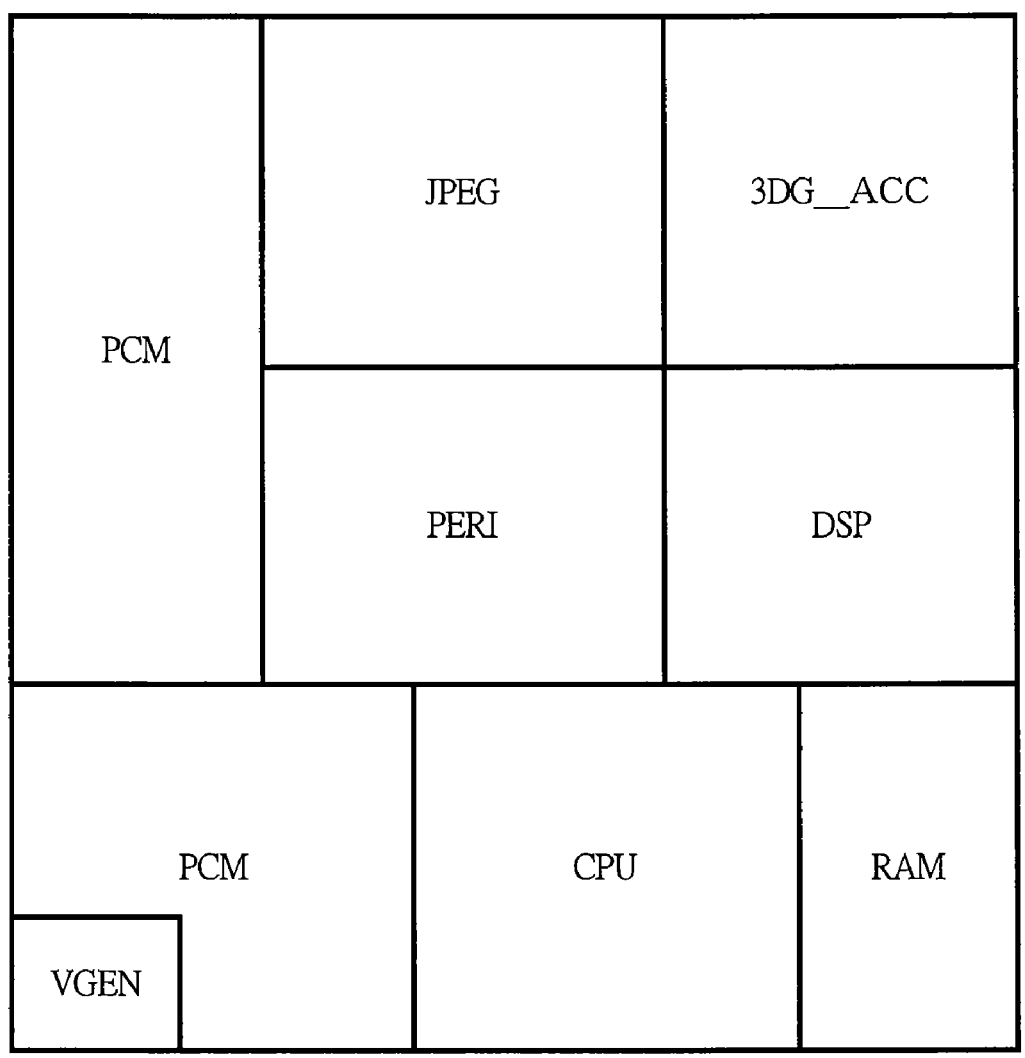
FIG. 18 is a schematic layout showing a case where the semiconductor device according to the embodiment of the present invention is applied to a system LSI (SOC)

FIG. 18 is a schematic layout of one example where the semiconductor device according to the embodiment of the present invention is applied to a system LSI (SOC). FIG. 18 shows, for example, a system LSI (SOC) for image processing. Its configuration is not particularly limited, but may include a central processing unit CPU, a phase-change memory PCM, a volatile memory RAM, an image processing accelerator ACC, an image compression processing unit JPEG, a 3D graphic accelerator 3DG_ACC, a peripheral circuit PERI, a digital signal processing circuit for camera DSP and so on, which are formed on a single semiconductor substrate through a known semiconductor manufacturing technology.

ACC and 3DG_ACC perform various computing processings for displaying images and 3D graphics. JPEG performs processing such as image compression and decompression. DSP performs various digital signal processings for image shooting. Note that, such accelerator and DSP assist the processing of CPU. PERI performs control over the entire chip and data input/output with respect to the external.

PCM has the configuration as described in the foregoing, and is disposed adjacently to CPU, for example. And, in PCM, the power-supply circuit VGEN having a temperature correcting function as described with reference to FIG. 5 and FIG. 6 or in FIG. 13 is arranged. Herein, in PCM, VGEN is arranged at a position farthest away from the arithmetic operation units such as CPU and the accelerator. That is, while these arithmetic operation units (in particular, CPU) become at a high temperature due to its power consumption, the write current of the set operation is decreased in the PCM by a temperature correction as the temperature is increased. In that case, to avoid the worst scenario of write-current shortage due to excessive temperature correction, it is desirable to arrange VGEN at a position where the temperature of the memory-cell array in PCM can be reflected, in particular, where the temperature becomes as low as possible.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, by using the temperature correcting function as described above, when the temperature gradient of the resistance of the reset element varies among the elements, writing is performed particularly at the low temperature (TL), and then reading is performed at the high temperature (TH), thereby selecting an element having a temperature gradient more than expected as a defective bit. It is also effective to mount an error correction circuit to rescue the element where an error occurs due to a temperature change. Furthermore, when the temperature of the environment in which the phase-change element is used is always constant, a temperature characteristic is not particularly required for the write operation, but the present invention can also be applied without posing a problem.

INDUSTRIAL APPLICABILITY

The semiconductor device according to the present invention is particularly beneficial to a technology effectively applied to products that may possibly be used under various temperature conditions, as typified by mobile devices by way of example, as an on-chip memory of a system LSI (SOC) mounted in the products. This is not limited, and the semiconductor device according to the present invention can be widely applied to system LSIs, microcomputers, single memory products, or the like for use in various fields.

The invention claimed is:

1. A semiconductor device comprising:
    a memory-cell array including a plurality of word lines extending in a first direction, a plurality of bit lines extending in a second direction crossing the plurality of word lines, and a plurality of memory cells arranged at intersections of the plurality of word lines and the plurality of bit lines;
    a plurality of word driver circuits connected to the plurality of word lines;
    a plurality of read circuits and a plurality of write circuits connected to the plurality of bit lines; and
    a pulse-generating circuit comprising a plurality of NMOS transistors and a plurality of depletion MOS transistors configured to output a pulse based on a temperature characteristic,
    wherein each of the plurality of memory cells includes
        a first node connected to a corresponding one of the plurality of word lines;
        a second node connected to a corresponding one of the plurality of bit lines;
        a third node provided correspondingly to the second node;
        a memory element in which a crystalline state is formed by a set operation and an amorphous state is formed by a reset operation; and
        a switch element in which a current path from the second node to the third node via the memory element is formed upon reception of control of the first node,
    wherein, at the time of the set operation, a first pulse is first input to the memory element and subsequently a second pulse is input, and
    wherein a magnitude of the second pulse is changed by the pulse-generating circuit depending on an external temperature.

2. The semiconductor device according to claim 1,
    wherein, at the time of the reset operation, a third pulse is input, and
    wherein the third pulse has a constant magnitude independent of the external temperature.

3. The semiconductor device according to claim 1,
    wherein the first and second pulses are voltage pulses, and
    wherein the second pulse has a voltage value that is smaller than a voltage value of the first pulse and is decreased as the external temperature is increased.

4. The semiconductor device according to claim 1,
    wherein the first and second pulses are current pulses, and
    wherein the second pulse has a current value that is smaller than a current value of the first pulse and is decreased as the external temperature is increased.

5. The semiconductor device according to claim 2,
    wherein the first pulse and the third pulse are identical to each other.

6. The semiconductor device according to claim 3 further comprising:
    a power-supply circuit that generates a voltage value of the second pulse, and
    wherein the power-supply circuit generates a temperature-dependent voltage value by using a temperature characteristic of a MOS transistor.

7. The semiconductor device according to claim 6,
    wherein the power-supply circuit includes:
    a circuit that generates a temperature-dependent current by using a temperature characteristic of an off current of a MOS transistor; and
    a circuit that supplies the generated current to MOS transistors of two types different in a gradient of a characteristic of drain current/gate voltage and extracts a difference of gate voltages appearing between respective MOS transistors.

8. The semiconductor device according to claim 6,
    wherein the power-supply circuit is arranged at a position having a relatively low temperature among positions adjacent to the memory-cell array.

* * * * *